(12) United States Patent
Eriksson et al.

(10) Patent No.: US 8,917,239 B2
(45) Date of Patent: Dec. 23, 2014

(54) REMOVABLE PROTECTIVE COVER WITH EMBEDDED PROXIMITY SENSORS

(71) Applicant: Neonode Inc., Santa Clara, CA (US)

(72) Inventors: Thomas Eriksson, Stocksund (SE); Stefan Holmgren, Sollentuna (SE); Johnn Karlsson, Märsta (SE); Remo Behdasht, New South Wales (AU); Erik Rosengren, Stockholm (SE); Lars Sparf, Vällingby (SE)

(73) Assignee: Neonode Inc., Santa Clara, CA (US)

( * ) Notice: Subject to any disclaimer, the term of this patent is extended or adjusted under 35 U.S.C. 154(b) by 42 days.

(21) Appl. No.: 13/775,269

(22) Filed: Feb. 25, 2013

(65) Prior Publication Data

US 2014/0104160 A1    Apr. 17, 2014

Related U.S. Application Data

(63) Continuation-in-part of application No. 13/732,456, filed on Jan. 2, 2013, now Pat. No. 8,643,628.

(60) Provisional application No. 61/713,546, filed on Oct. 14, 2012.

(51) Int. Cl.
*G09G 5/00* (2006.01)
*G06F 3/042* (2006.01)
*G06F 3/01* (2006.01)

(52) U.S. Cl.
CPC ............... *G06F 3/017* (2013.01); *G06F 3/042* (2013.01)
USPC .......................................... 345/156; 345/173

(58) Field of Classification Search
USPC ........................ 345/156–179; 455/572, 575.8
See application file for complete search history.

(56) References Cited

U.S. PATENT DOCUMENTS

| | | | |
|---|---|---|---|
| 5,103,085 | A | 4/1992 | Zimmerman |
| 5,463,725 | A | 10/1995 | Henckel et al. |
| 5,889,236 | A | 3/1999 | Gillespie et al. |
| 6,646,633 | B1 | 11/2003 | Nicolas |
| 6,874,683 | B2 | 4/2005 | Keronen et al. |

(Continued)

FOREIGN PATENT DOCUMENTS

| | | |
|---|---|---|
| WO | 2010011929 A1 | 1/2010 |
| WO | 2012089957 A1 | 7/2012 |
| WO | 2012089958 A1 | 7/2012 |

OTHER PUBLICATIONS

Hodges, S., Izadi, S., Butler, A., Rrustemil A. and Buxton, B., "ThinSight: Versatile Multitouch Sensing for Thin Form-Factor Displays", UIST'07, Oct. 7-10, 2007. http://www.hci.iastate.edu/REU09/pub/main/telerobotics_team_papers/thinsight_versatile_multitouch_sensing_for_thin_formfactor_displays.pdf.

(Continued)

*Primary Examiner* — Premal Patel
(74) *Attorney, Agent, or Firm* — Soquel Group LLC

(57) ABSTRACT

A removable cover for a handheld electronic device, including a protective cover that at least partially covers rear and side surfaces of a handheld electronic device, a plurality of proximity sensors mounted in the cover for detecting user gestures performed outside of the electronic device, a battery, wireless communication circuitry, and a processor configured to operate the proximity sensors, and to operate the wireless communication circuitry to transmit commands to the electronic device based on gestures detected by the proximity sensors.

18 Claims, 23 Drawing Sheets

(56) References Cited

U.S. PATENT DOCUMENTS

| | | |
|---|---|---|
| 7,046,232 B2 | 5/2006 | Inagaki et al. |
| 7,221,462 B2 | 5/2007 | Cavallucci |
| 7,518,738 B2 | 4/2009 | Cavallucci et al. |
| 8,120,625 B2 | 2/2012 | Hinckley |
| 8,193,498 B2 | 6/2012 | Cavallucci et al. |
| 8,289,299 B2 | 10/2012 | Newton |
| 2001/0043189 A1 | 11/2001 | Brisebois et al. |
| 2004/0056199 A1 | 3/2004 | O'Connor et al. |
| 2005/0093846 A1 | 5/2005 | Marcus et al. |
| 2006/0077186 A1 | 4/2006 | Park et al. |
| 2006/0161870 A1 | 7/2006 | Hotelling et al. |
| 2006/0161871 A1 | 7/2006 | Hotelling et al. |
| 2006/0238517 A1* | 10/2006 | King et al. .................. 345/173 |
| 2006/0244733 A1 | 11/2006 | Geaghan |
| 2008/0012835 A1 | 1/2008 | Rimon et al. |
| 2008/0089587 A1 | 4/2008 | Kim et al. |
| 2008/0096620 A1* | 4/2008 | Lee et al. .................. 455/575.8 |
| 2008/0100593 A1 | 5/2008 | Skillman et al. |
| 2008/0134102 A1 | 6/2008 | Movold et al. |
| 2009/0139778 A1 | 6/2009 | Butler et al. |
| 2009/0166098 A1 | 7/2009 | Sunder |
| 2010/0013763 A1* | 1/2010 | Futter et al. .................. 345/158 |
| 2010/0031203 A1 | 2/2010 | Morris et al. |
| 2010/0134424 A1 | 6/2010 | Brisebois et al. |
| 2010/0299642 A1* | 11/2010 | Merrell et al. .................. 715/863 |
| 2010/0321289 A1* | 12/2010 | Kim et al. .................. 345/156 |
| 2011/0005367 A1 | 1/2011 | Hwang et al. |
| 2011/0087963 A1 | 4/2011 | Brisebois et al. |
| 2011/0179368 A1 | 7/2011 | King et al. |
| 2011/0310005 A1 | 12/2011 | Chen et al. |

OTHER PUBLICATIONS

Moeller, J., Lupfer, N., Hamilton, B., Lin, H. and Kerne, A., "IntangibleCanvas: Free-Air Finger Painting on a Projected Canvas", CHI 2011, Proceedings of the 2011 Annual Conference on Human Factors in Computing Systems, Extended Absracts, ACM, New York, NY, May 2011, pp. 1615-1620.

Moeller, J., Hamilton, B., Lupfer. N., Webb, A. and Kerne, A., "ZeroTouch: A Zero-Thickness Optical Multi-Touch Force Field", CHI 2011, Proceedings of the 2011 Annual Conference on Human Factors in Computing Systems, Extended Abstracts, ACM, New York, NY, May 2011, pp. 1165-1170.

Moeller, J. and Kerne, A., "ZeroTouch: An Optical Multi-Touch and Free-Air Interaction Architecture", CHI 2012, Proceedings of the 2012 Annual Conference on Human Factors in Computing Systems, extended abstracts, ACM, New York, NY, May 2012, pp. 2165-2174.

Butler et al., "SideSight: Multi-touch Interaction around Smart Devices." UIST'08, Oct. 2008. http://131.107.65.14/en-us/um/people/shahrami/papers/sidesight.pdf.

* cited by examiner

REMOVABLE PROTECTIVE COVER WITH EMBEDDED PROXIMITY SENSORS

CROSS REFERENCES TO RELATED APPLICATIONS

This application is a continuation-in-part of U.S. patent application Ser. No. 13/732,456, entitled LIGHT-BASED PROXIMITY DETECTION SYSTEM AND USER INTERFACE, filed on Jan. 3, 2013 by inventors Thomas Eriksson and Stefan Holmgren, the contents of which are hereby incorporated herein in their entirety.

This application claims priority benefit of U.S. Provisional Patent Application Ser. No. 61/713,546, entitled LIGHT-BASED PROXIMITY DETECTION SYSTEM AND USER INTERFACE, filed on Oct. 14, 2012 by inventor Stefan Holmgren, the contents of which are hereby incorporated herein in their entirety.

FIELD OF THE INVENTION

The field of the present invention is light-based proximity sensors, graphical user interfaces and wireless input devices.

BACKGROUND OF THE INVENTION

Conventional touch sensitive virtual buttons, i.e., buttons painted on a stationary flat surface and actuated by touch, are capacitance-based or resistance-based. Certain touch sensitive user input systems detect hovering objects as well. Examples include U.S. Publication No. 2008/0012835 A1 for HOVER AND TOUCH DETECTION FOR DIGITIZER and U.S. Publication No. 2006/0244733 A1 for TOUCH SENSITIVE DEVICE AND METHOD USING PRE-TOUCH INFORMATION.

Prior art hover detection systems based on reflected light determine a height of an object above a surface based on an amount of reflected light: the nearer the object—the more light is reflected onto the detector situated beneath the touch surface. Therefore, prior art systems are able to detect a hovering object over time and determine whether the object is moving closer or farther away based on relative amounts of detected light. I.e., diminishing light detection over time indicates an object moving away from the surface, and increasing light detection over time indicates an object moving toward the surface. In other words, the determined height is relative to other heights in a series of detections, but the actual height remains unknown. Indeed, different materials reflect different amounts of light, e.g., a white glove reflects more light than a black glove, and the reflective properties of a hovering object are not known by the system. Therefore, the system cannot determine the height at which the object is situated above the surface based on the amount of reflected light detected. In addition, because prior art proximity detectors require a series of detections of the object at different heights in order to rank the heights in relation to each other, a single proximity detection or a series of detections of a stationary hovering object will provide little information about the height of the object.

Graphical user interfaces (GUIs) enable interaction with visual elements displayed on a screen. When the extent of a GUI exceeds that of the screen, a user is restricted to interacting with only the portion of the GUI that is displayed on the screen. In order to activate a visual element virtually located outside of the displayed portion of the GUI, the user must pan the GUI, moving a portion of the GUI from outside of the display into the display, while displacing a currently displayed portion of the GUI out of the display. It would thus be of advantage to enable user interactions with GUI elements that are virtually located beyond the display area of the screen, without panning the GUI.

Wireless communication is the transfer of data between two or more devices that are not connected by a physical conductor. Common wireless technologies use electromagnetic wireless telecommunication, including inter alia radio. BLUETOOTH® is a wireless technology standard for exchanging data over short distances, using short wavelength radio transmission in the ISM band from 2400-2480 MHz. Two popular wireless applications are a hands-free headset for controlling a mobile phone, and a wireless mouse for a personal computer.

SUMMARY

Aspects of the present invention relate to touch sensitive surfaces used to implement switches or slider controls for handheld devices such as mobile phones, office equipment such as printers and mufti-function peripheral devices, and household appliances such as washing machines and microwave ovens. Additional user interfaces and devices are disclosed hereinbelow.

Further aspects of the present invention relate to GUIs and, in particular, to user interaction with GUI elements that are virtually located beyond the extent of the display screen.

Further aspects of the present invention relate to GUIs for applications running on a device, which respond to tap and slide gestures along outside edges of the device, and to hand wave gestures above the device.

Further aspects of the present invention relate to a removable protective device cover that includes proximity sensors, for detecting user gestures performed outside of the device, including contact user gestures performed on a surface of the cover, and non-contact user gestures performed in the air, in the vicinity of the device.

Further aspects of the present invention relate to a removable protective device cover that is in wireless communication with the covered device. The protective device cover includes proximity sensors for detecting user gestures performed outside of the device, and communicates the detected gestures to the device via a wireless communication protocol such as BLUETOOTH®. In this manner, a user controls the device through gestures detected by the protective cover.

There is thus provided in accordance with an embodiment of the present invention an electronic device, including a housing, a display mounted in the housing, a plurality of proximity sensors mounted in the housing near the edges of the display and directed outward from the display, for detecting presence of an object outside the display and near the edges of the display, and a processor mounted in the housing and coupled with the display and with the proximity sensors, for operating the device responsive to user activation of elements of a graphical user interface (GUI), the GUI including a displayed portion that is rendered by the processor on the display, and a virtual non-displayed portion that extends beyond the edges of the display, wherein the processor operates the device responsive to user activation of elements of the virtual portion of the GUI, based on the proximity sensors detecting presence of an object in the non-displayed portion of the GUI.

There is additionally provided in accordance with an embodiment of the present invention a camera, including a housing, a viewfinder mounted in the housing, a plurality of proximity sensors mounted in the housing near the edges of the viewfinder and directed outward from the viewfinder, for detecting presence of a finger outside the viewfinder and near the edges of the viewfinder, and a processor mounted in the housing and coupled with the viewfinder and with the proximity sensors, wherein the processor causes the camera to capture a current frame in the viewfinder in response to a user tap at a first location on the outside of the edges of the viewfinder, based on the proximity sensors detecting presence of a finger.

There is further provided in accordance with an embodiment of the present invention an electronic device, including a housing, a display mounted in the housing, a plurality of proximity sensors mounted in the housing near the edges of the display and directed outward from the display, for detecting presence of an object outside the display and near the edges of the display, and a processor mounted in the housing and coupled with the display and with the proximity sensors, for operating the device responsive to user activation of a virtual control located along the outside of an edge of the device, wherein the processor operates the device responsive to user activation of the virtual control, based on the proximity sensors detecting presence of an object outside the edge of the device.

There is yet further provided in accordance with an embodiment of the present invention an electronic device, including a housing, a display mounted in the housing, a plurality of proximity sensors mounted in the housing near the edges of the display and directed upwards from the display, for detecting presence of an object above the display, and a processor mounted in the housing and coupled with the display and to said proximity sensors, wherein the processor operates the device responsive to a user wave gesture above the display, based on the proximity sensors detecting presence of an object above the display.

There is moreover provided in accordance with an embodiment of the present invention a removable cover for a handheld electronic device, including a protective cover that at least partially covers rear and side surfaces of a handheld electronic device, a plurality of proximity sensors mounted in the cover for detecting user gestures performed outside of the electronic device, a battery, wireless communication circuitry, and a processor configured to operate the proximity sensors, and to operate the wireless communication circuitry to transmit commands to the electronic device based on gestures detected by the proximity sensors.

BRIEF DESCRIPTION OF THE DRAWINGS

The present invention will be more fully understood and appreciated from the following detailed description, taken in conjunction with the drawings in which.

Figure 1:
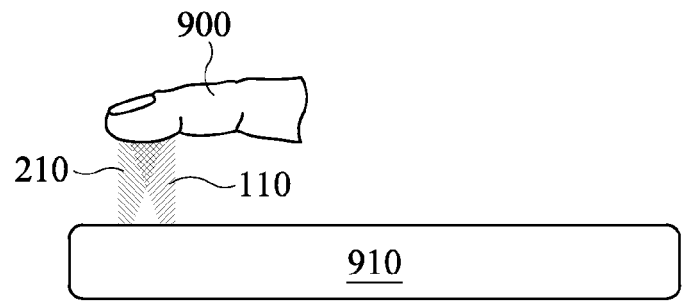
FIG. 1 is a simplified illustration of a proximity sensor having one emitter-detector channel, in accordance with an embodiment of the present invention.

In this specification and in the figures, the following numbering scheme is used. Light emitting elements and emitted light beams are numbered in the range of 100-199. Light receiving elements such as PDs, and reflected light beams are numbered in the range of 200-299. Lens components, reflective and refractive elements are numbered in the range of 300-399. Fingers, styli, electronic devices and their housings are numbered in the range of 900-999.

The following tables catalog the numbered elements and list the figures in which each numbered element appears.

Emitters and Emitter Beams

| Element | FIGS. | Description |
|---|---|---|
| 110-114, 123, 124, 126, 127 | 1-3, 7, 8, 12, 23, 30, 31 | emitter beams |
| 121-125 | 4, 7-13, 15, 16, 18, 37-39 | emitters |

Receivers and Receiver Beams

| Element | FIGS. | Description |
|---|---|---|
| 210-213, 223-227 | 1, 30, 31 | receiver beams |
| 221, 221.1, 221.2, 221.3, 221.4, 222 | 4-6, 37, 38 | receivers |

Lenses

| Element | FIGS. | Description |
|---|---|---|
| 301-303 | 4-12, 14 | lenses |
| 303.1-303.3 | 15-17 | lens section |
| 310 | 20-22 | control window |
| 320 | 17 | diagonal face |

Miscellaneous Elements

| Element | FIGS. | Description |
|---|---|---|
| 900-905 | 1-3, 6, 20-22, 24, 25, 27, 33 | fingers |
| 906 | 24 | turntable |
| 907, 908 | 24 | slider |
| 909 | 20-23, 30, 32 | screen |
| 910 | 1-3, 20-23, 30-35 | device |
| 911-913 | 25 | drum |
| 914, 915 | 25 | cymbal |
| 916 | 25 | extension of drum |
| 917, 918 | 25 | extension of cymbal |
| 920 | 27 | shooter game |
| 921, 922 | 4-10 | upper casing part |
| 923 | 4-10 | PCB |
| 924 | 9, 10 | isolating barrier |
| 925 | 27 | gun sight |
| 926 | 27 | left arrow |
| 927 | 27 | right arrow |
| 928-930 | 27 | gun |
| 931, 941 | 11, 14-17 | upper casing part |
| 932, 942 | 11, 14-17 | lower casing part |
| 933 | 28 | car racing game |
| 934 | 28 | steering wheel |

Miscellaneous Elements

| Element | FIGS. | Description |
|---|---|---|
| 936 | 29 | MP3 player |
| 937 | 29 | Stereo dock |
| 938 | 29, 31, 32 | hand |
| 939, 946-949, 954, 955, 957, 964, 965 | 20-22, 29, 31, 32, 33 | arrow |
| 943 | 16 | PCB |
| 945 | 17 | air gap |
| 950 | 19 | light transmissive cover |
| 951 | 19 | cross shape |
| 970 | 34-38 | protective cover |
| 972 | 35-38 | front housing panel |
| 973 | 35, 37 | rear housing panel |
| 974 | 35-38 | battery |
| 976 | 35-38 | printed circuit board |
| 978, 979 | 35-38 | series of lenses |
| 980, 982 | 34-36, 38 | touch slider |
| 981 | 34 | touch slider length |
| 985 | 37, 39 | emitter/receiver driver |
| 986 | 37, 39 | CPU |
| 987 | 39 | BLUETOOTH(R) antenna |
| 990 | 38, 39 | power socket |
| 992, 993 | 38, 39 | control button |

DETAILED DESCRIPTION

Aspects of the present invention relate to light-based touch controls such as virtual buttons, sliders and touch pads. Aspects of the present invention also relate to proximity sensors for hover gestures. According to embodiments of the present invention, a light-based touch control and proximity sensor includes infra-red light-emitting diodes (LEDs) and photodiodes (PDs) situated inside a housing for an electronic device, beneath an infra-red-transmissive section of the housing. The LEDs project light substantially incident to the housing surface, through the transmissive section. When an object touches or approaches the transmissive section, it reflects the light back into the housing where it is detected by the PDs. Each detection of reflected light represents a detection channel.

A proximity sensor having only one LED and one PD has a single detection channel that provides one signal. In principle this signal provides binary (yes/no) information as to whether or not an object is present above the sensor. In addition, this signal provides information as to a direction of movement of the object along the proximity axis, i.e., whether the object is moving toward the sensor or away from the sensor. Thus, if the signal increases over time, the object is moving toward the sensor, whereas if the signal decreases over time, the object is moving away from the sensor.

Reference is made to FIG. 1, which is a simplified illustration of a proximity sensor having one emitter-detector channel, in accordance with an embodiment of the present invention. FIG. 1 illustrates an embodiment whereby one LED and one PD are situated together beneath a control surface embedded in the housing. In this embodiment one detection channel is provided.

FIG. 1 shows a portable electronic device 910 in profile view. An emitter beam 110 is projected above the device and is reflected back into the device by a finger 900 placed above the device. Thus, the light channel 110-210 is provided to detect a proximal finger 900.

As explained hereinabove, one example of the limitations of a single channel is that it is impossible determine a distance of the object from the sensor based on the strength of the detection signal since different objects can be used that have different reflective properties. For example, a black glove near the sensor and a white glove further away from the sensor provide substantially similar levels of detection. More channels generate more information. However, an extra channel does not necessitate adding an additional LED and an additional PD. Rather, several PDs can share the light from one LED to provide multiple detection channels. Similarly, one PD can provide multiple detection channels when it is able to receive reflected light from several LEDs.

Figure 2:
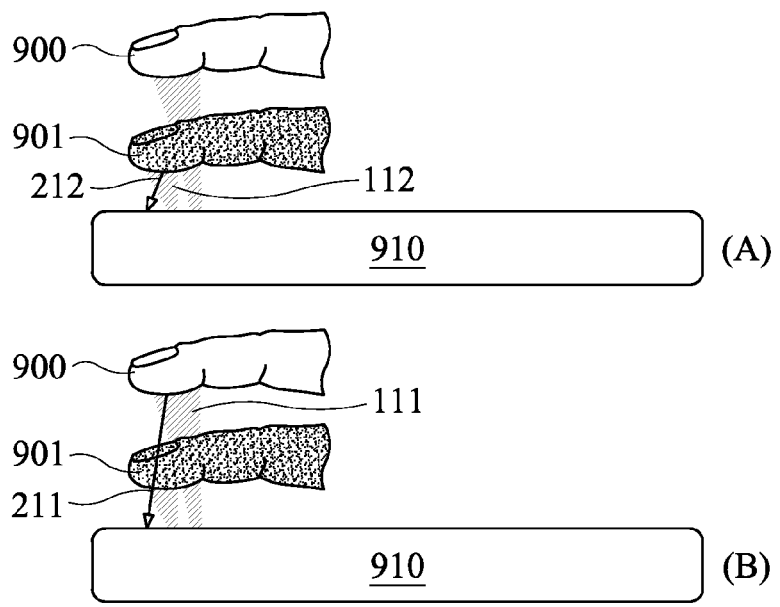
FIG. 2 is a simplified illustration of a first configuration of a proximity sensor having two emitter-detector channels, in accordance with an embodiment of the present invention.

Reference is made to FIG. 2, which is a simplified illustration of a first configuration of a proximity sensor having two emitter-detector channels, in accordance with an embodiment of the present invention. FIG. 2 illustrates two LEDs and one PD situated in a row beneath a control surface embedded in the housing. This row of two LEDs and one PD has one of the LEDs placed between the other LED and the PD. In this embodiment two detection channels are provided. With two channels positional information along one dimension can be generated by interpolation.

FIG. 2 shows a portable electronic device 910 in profile view and two emitter-detector light channels. Thus, FIG. 2(A) demonstrates a first light channel 112-212 that detects a near finger 901; and FIG. 2(B) demonstrates a second light channel 111-211 that detects a more distant finger 900. The emitter beams 111 and 112 issue forth from the upper surface of device 910 at an angle in order that their respective reflected beams arrive at the location of the detector. The proximity detector of FIG. 2 provides an indication of the height of the object based on which channel is detected. An interpolation of signals from the two channels will indicate a position of the object within the range of heights detected by both channels.

By contrast, prior art proximity detectors determine proximity based on a relative intensity of a reflected signal and require a series of detections in order to rank the different signals, as explained hereinabove. Thus, the system of FIG. 2 addresses two shortcomings of the prior art: 1. it provides an indication of the absolute height of the object above the screen, as opposed to a relative height; and, 2. it provides this indication based on detections of a stationary object and does not require a series of detections over time.

Two similar detection channels are provided by two detectors and one emitter, for example by replacing the emitters of the FIG. 2 system with detectors, and replacing the detector of the FIG. 2 system with an emitter. In this case, beams 211 and 212 are one and the same emitter beam issued by the one emitter, and the reflected beam 111 or 112 arrives at one of the two detectors depending on the height of the finger 900 or 901 above the device 910.

Figure 3:
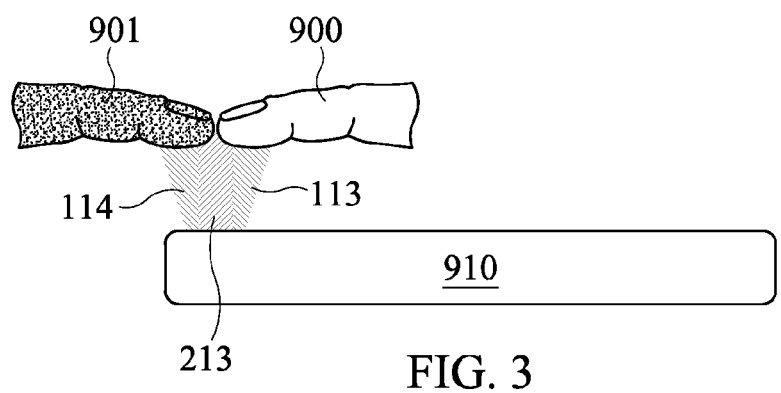
FIG. 3 is a simplified illustration of a second configuration of a proximity sensor having two emitter-detector channels, in accordance with an embodiment of the present invention.

Reference is made to FIG. 3, which is a simplified illustration of a second configuration of a proximity sensor having two emitter-detector channels, in accordance with an embodiment of the present invention. FIG. 3 shows a portable device 910 with two detection channels, but in this case the detector is situated between the two emitters and the two channels provide lateral position information. A first emitter beam 113 is projected above the device to the right of the detector, and a second emitter beam 114 is projected above the device to the left of the detector. When a finger hovers above the space between the first emitter and the detector, as illustrated by finger 900 in FIG. 3, it creates a first detection channel 113-213. When a finger hovers above the space between the second emitter and the detector, as illustrated by finger 901 in FIG. 3, it creates a second detection channel 114-213. An interpolation of signals from the two channels indicates a position of the object between the outermost components. As explained hereinabove, the emitters and detectors may be swapped and still provide two similar detection channels.

Aspects of the invention relate to providing a thin window spanning the height or thickness of a device, such as a mobile phone. The user interacts with the phone by performing finger gestures against this window, and the proximity sensor detects the position or gesture of the finger. One application is to replace physical buttons. In the most basic case light from an LED is sent out of the device and reflected by the finger. The reflected light is detected by two PDs situated on either side of the LED and the position of the finger is interpolated from the signals. For instance such an arrangement may replace the volume buttons on a mobile phone. In principle such an arrangement may have limited proximity functionality. This conceptual model can be extended with additional components.

Figure 4:
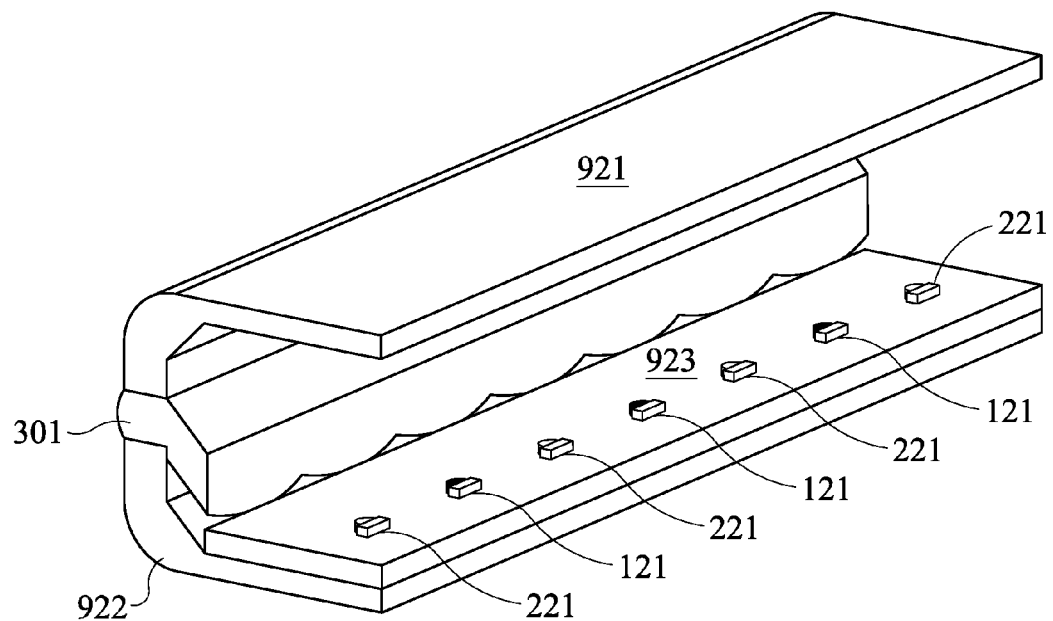
FIGS. 4 and 5 are simplified diagrams of a touch sensitive slider window featuring multiple emitter-detector channels that detect a location of a finger along the length of the window, in accordance with an embodiment of the present invention.
Figure 5:
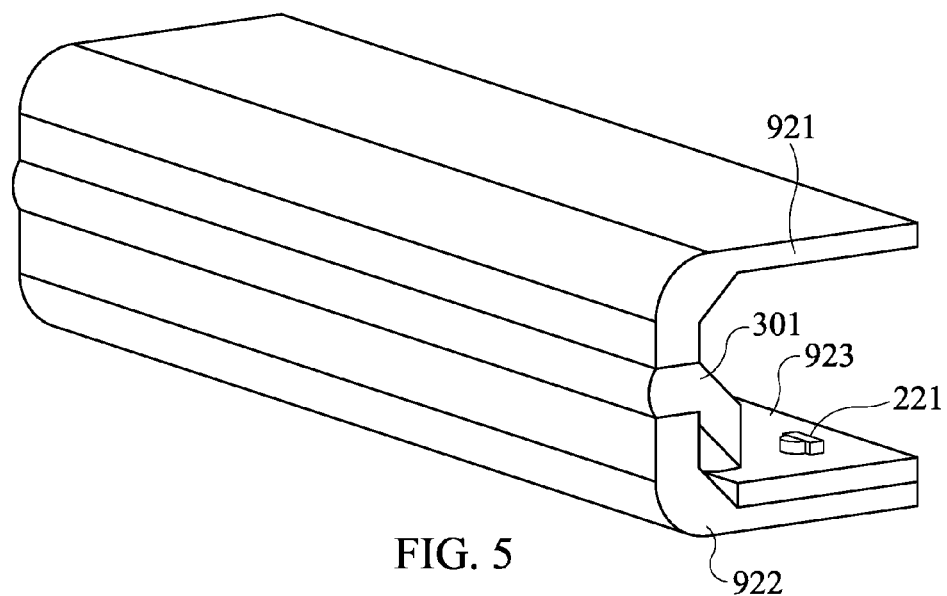
Figure 6:
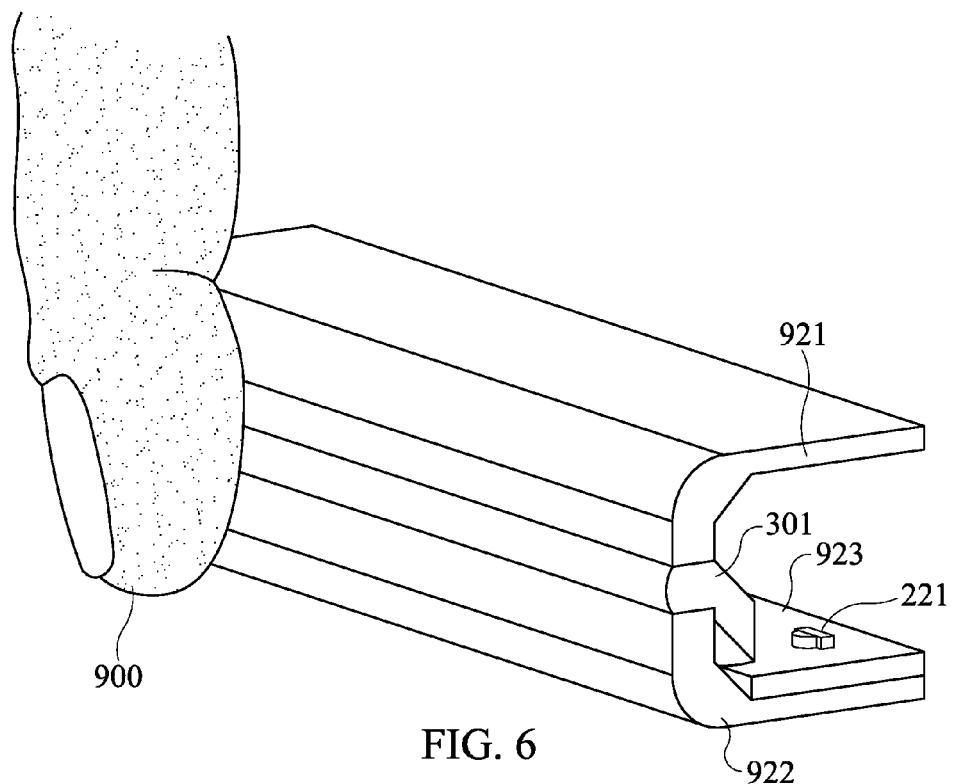
FIG. 6 is a simplified illustration of a finger placed along the touch sensitive slider window of FIGS. 4 and 5, in accordance with an embodiment of the present invention.

Reference is made to FIGS. 4 and 5, which are simplified diagrams of a touch sensitive slider window featuring multiple emitter-detector channels that detect a location of a finger along the length of the window, in accordance with an embodiment of the present invention. Reference is also made to FIG. 6, which is a simplified illustration of a finger placed along the touch sensitive slider window of FIGS. 4 and 5, in accordance with an embodiment of the present invention. FIGS. 4 and 5 show front and back views of a touch sensitive slider window featuring multiple emitter-detector channels that detect a location of a finger along the length of the window. FIGS. 4 and 5 show a sidewall of a device housing formed by an upper casing part 921 and a lower casing part 922. A lens 301 is wedged between casing parts 921 and 922. FIGS. 4 and 5, and in particular FIG. 4, show a PCB 923 placed inside the device housing. Light emitters 121 and light detectors 221 are mounted in an alternating row on PCB 923. Every emitter-detector pair of neighboring elements provides a detection channel for detecting an object touching the outer side edge of the housing along the length of lens 301, as illustrated by finger 900 in FIG. 6.

When the emitters and detectors are placed together inside the housing, light scatters inside the housing when an emitter is activated and a portion of the scattered light arrives at the detectors without being reflected by an object outside lens 301. In order to minimize the amount of scattered light that reaches the detectors, the emitters and detectors are mounted on PCB 923 facing opposite directions.

Figure 7:
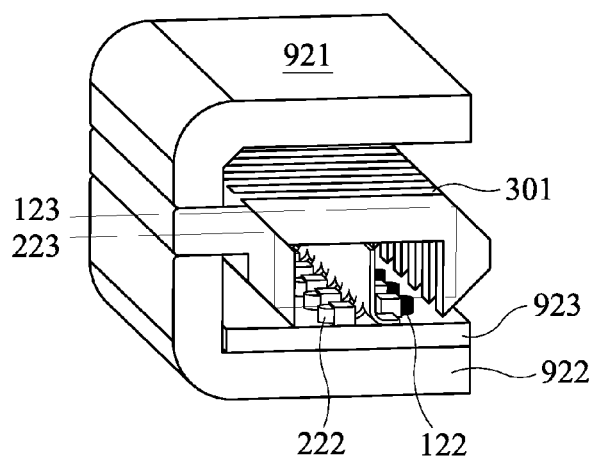
FIGS. 7-10 are simplified diagrams showing different views of a touch sensitive slider window featuring multiple emitter-detector channels that detect a location of a finger along the length of the window, in accordance with an embodiment of the present invention.
Figure 8:
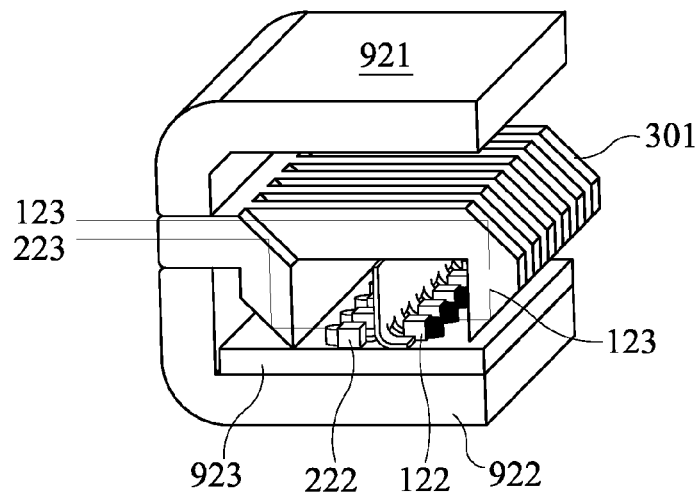
Figure 10:
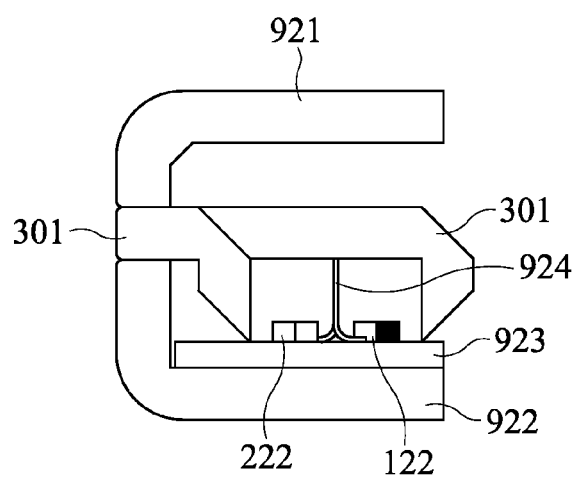
Figure 9:
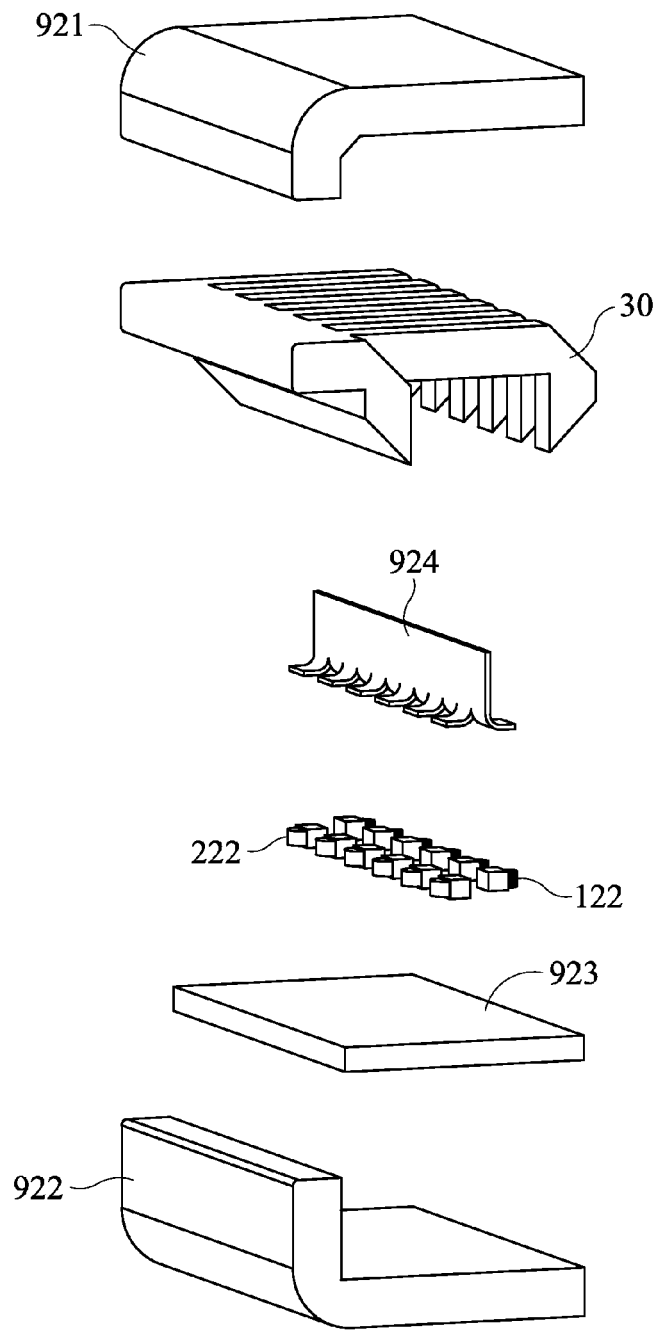

Reference is made to FIGS. 7-10, which are simplified diagrams showing different views of a touch sensitive slider window featuring multiple emitter-detector channels that detect a location of a finger along the length of the window, in accordance with an embodiment of the present invention. FIGS. 7-10, showing inward-facing emitters 122 and outward-facing detectors 222. In addition, an isolating barrier 924 is placed between the emitters and the detectors to further shield the detectors from scattered light. FIG. 9 is an exploded view of this configuration. FIG. 10 is a cross-section view of the same configuration.

Lens 301 in FIGS. 7-10 is more complex than lens 301 in FIGS. 4 and 5. In FIGS. 7-10, in order to direct light from the inward-facing emitters out through lens 301 and back onto the outward-facing detectors, lens 301 extends over and around the emitters 122 but not the detectors 222. Two light paths are shown in FIGS. 7 and 8. Emitter beam 123 is reflected twice inside lens 301 before it travels over emitter 122 and out of the device. Incoming beam 223 enters lens 301 and is reflected twice inside the lens before arriving at detector 222.

Figure 11:
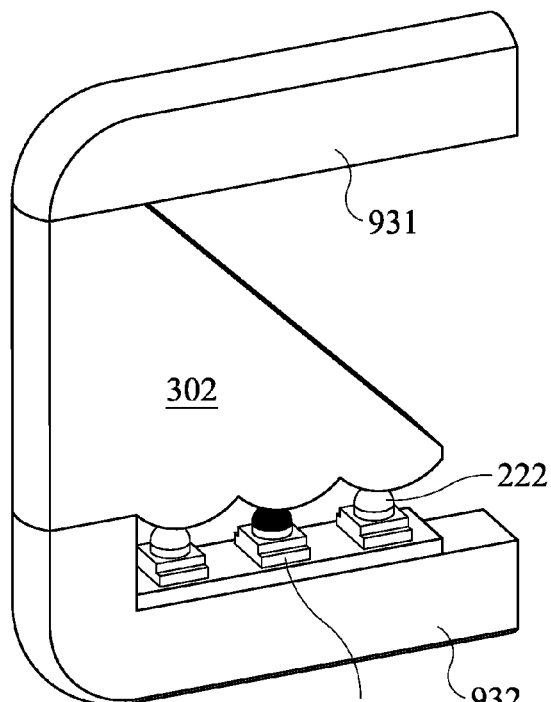
FIGS. 11-13 are simplified diagrams of a touch sensitive slider window featuring two emitter-detector channels that detect a location of a finger along the height of the window, in accordance with an embodiment of the present invention.
Figure 12:
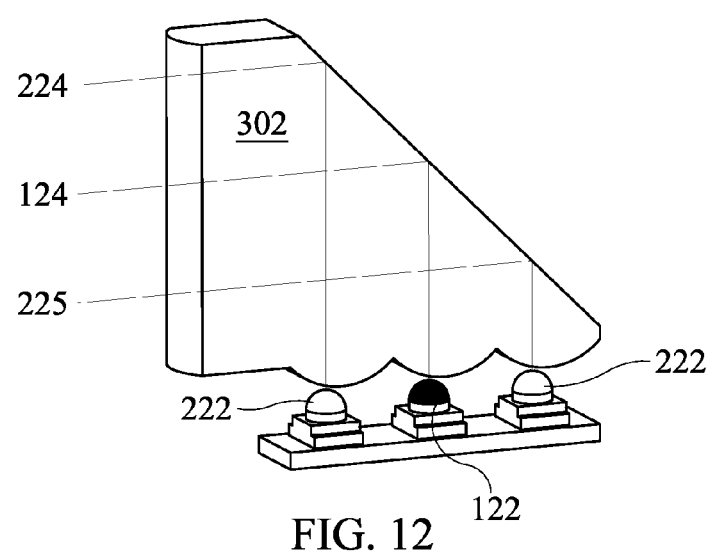
Figure 13:
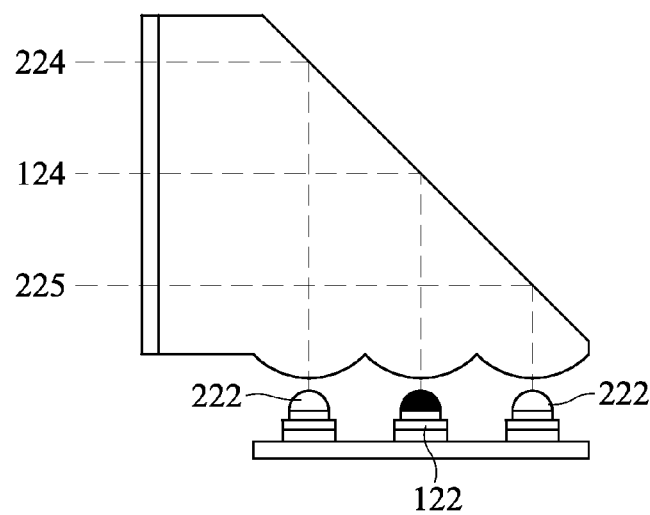

Reference is made to FIGS. 11-13, which are simplified diagrams of a touch sensitive slider window featuring two emitter-detector channels that detect a location of a finger along the height of the window, in accordance with an embodiment of the present invention. FIGS. 11-13 illustrate another configuration of a two-channel control. In this case, the control detects objects along the height of the device rather than along the length of the device as in FIGS. 3-10. FIGS. 11-13 show upper and lower casing parts 931 and 932. One emitter 122 and two receivers 222 are connected to lower casing part 932. The detection channels are made possible by a reflecting lens 302 inserted between casing parts 931 and 932. The light path from emitter 122 through lens 302 is illustrated in FIG. 12 as outgoing emitter beam 124. The light paths of the two incoming beams 224 and 225 that are directed at the two detectors 222 are also illustrated in FIG. 12. FIG. 13 is a cross-section view of lens 302 and the light beam paths 124, 224 and 225 of FIG. 12.

With three channels, position information in two dimensions is obtained. One application is an optical joystick. A second application is a two-dimensional navigation pad. A third application is a mouse touchpad. For example, arranging three emitters at three corners of an equilateral triangle and placing a detector at the triangle's center of gravity provides three detection signals. By interpolating the signals, a two-dimensional location of the object is obtained. As a second example, begin with the two channels of FIG. 2 to provide height information, and add one channel to provide lateral information as in FIG. 3.

Figure 14:
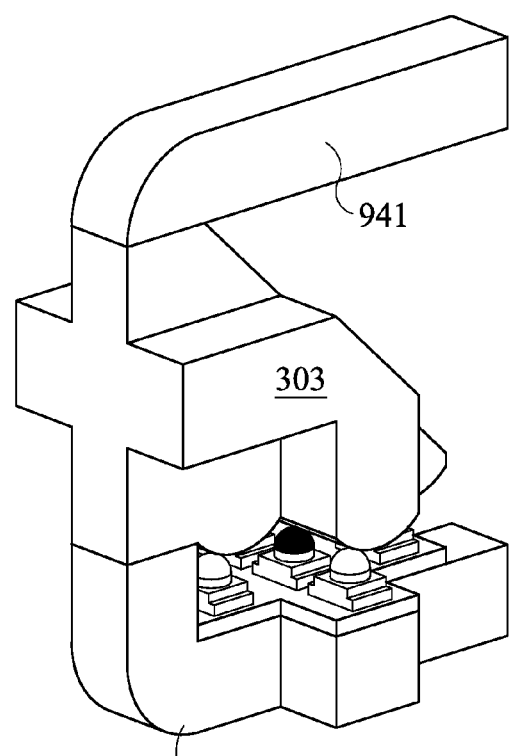
FIG. 14-17 are simplified diagrams of a configuration of a touch sensitive window featuring four emitter-detector channels operative to detect a glide movement in both horizontal and vertical directions, in accordance with an embodiment of the present invention.

Reference is made to FIGS. 14-17, which are simplified diagrams of a configuration of a touch sensitive window featuring four emitter-detector channels operative to detect a glide movement in both horizontal and vertical directions, in accordance with an embodiment of the present invention. FIGS. 14-17 illustrate a cross-bar control for detecting up-down and right-left movements of a finger or other object. The illustrated control has four detection channels created by one central emitter 122 surrounded by four detectors 222.1-222.4. An alternative configuration has one central detector surrounded by four emitters and is similar in operation to the system of FIGS. 14-17. FIG. 14 shows a lens 303 situated between upper and lower casing parts 941 and 942 and the five components (emitters and receivers) mounted inside the device on a PCB (943 in FIG. 16) connected to the lower casing part. An outer cross-shaped surface of lens 303 is flush with the outer casing.

Figure 15:
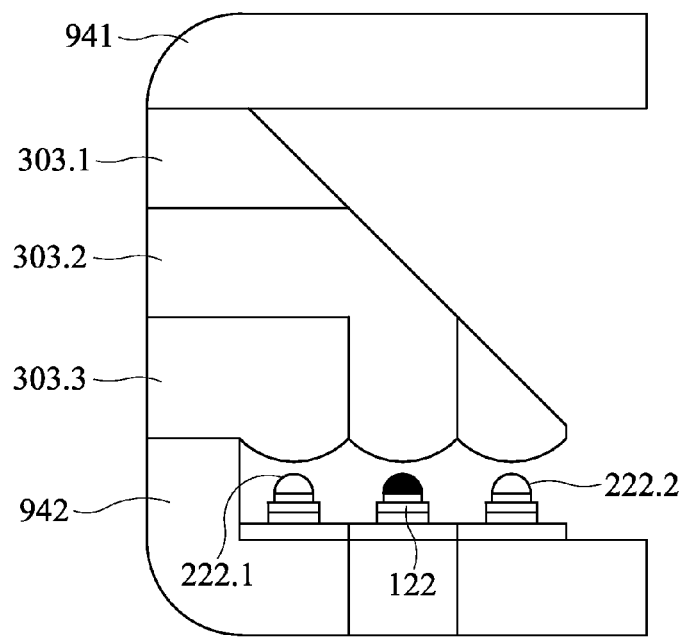

FIG. 15 is a cross-sectional view of the system shown in FIG. 14. Lens 303 is shown divided into sections to illustrate how each section is used by a different component. Detector 222.1 receives light beams that enter the lens through section 303.1; emitter 122 uses section 303.2 to reflect light out of the lens; detector 222.2 receives light beams that enter the lens through section 303.3.

Figure 16:
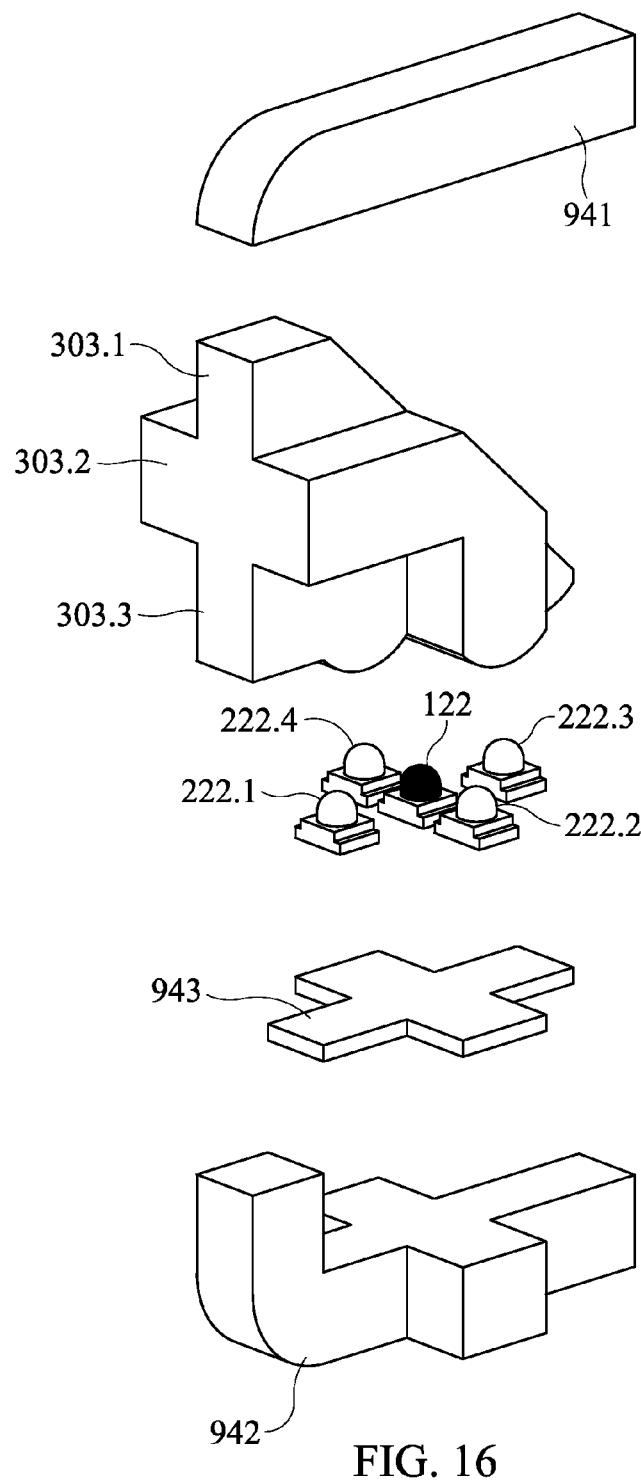

FIG. 16 is an exploded view of the system shown in FIG. 15. FIG. 16 shows detectors 222.1-222.4 and emitter 122; PCB 943; upper and lower casing parts 941 and 942; and lens 303 divided into upper section 303.1, middle section 303.2 and lower section 303.3.

Figure 17:
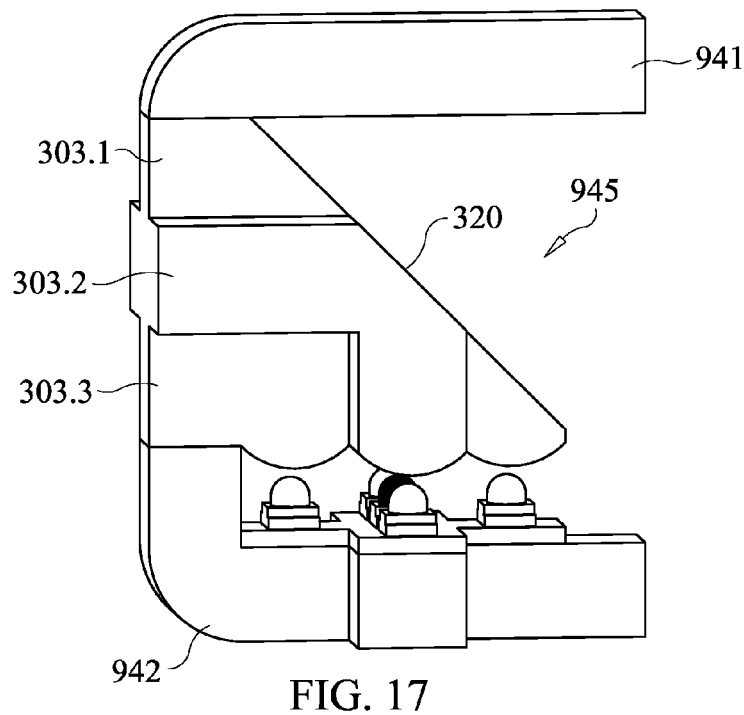

FIG. 17 is a slightly rotated side view of the system of FIG. 16. FIG. 17 illustrates how middle section 303.2 of the lens is used by detectors 222.2 and 222.4 in addition to emitter 122. An air gap 945 behind lens 303 is also shown. The purpose of air gap 945 is to make the diagonal face 320 of lens 303 internally reflective.

Figure 18:
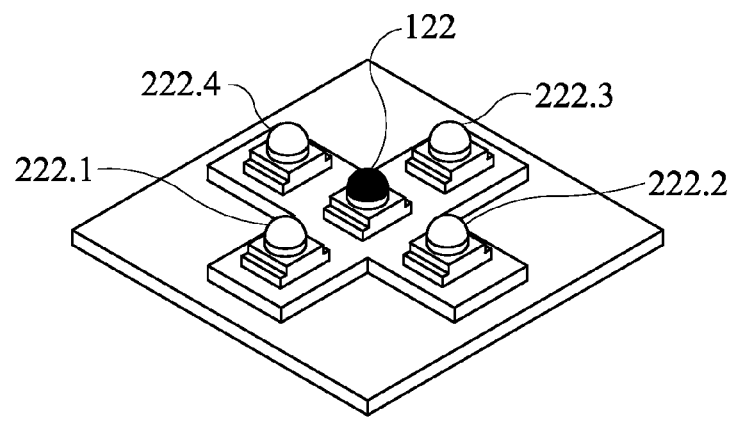
FIGS. 18-19 are simplified illustrations of top-shooting diodes in a configuration of a touch sensitive window featuring four emitter-detector channels operative to detect a glide movement in both horizontal and vertical directions, in accordance with an embodiment of the present invention.
Figure 19:
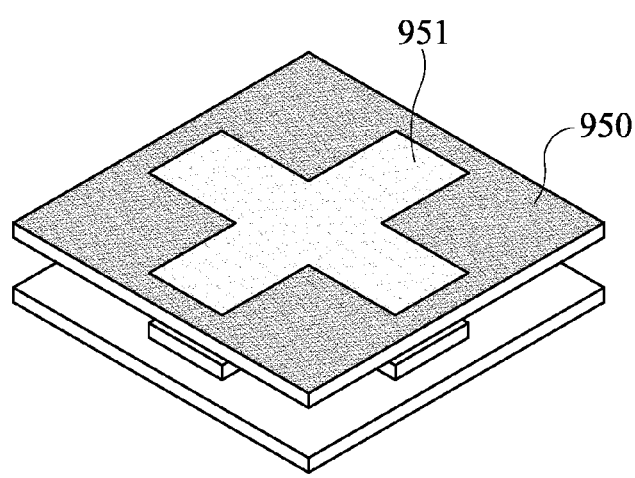

Reference is made to FIGS. 18 and 19, which are simplified illustrations of top-shooting diodes in a configuration of a touch sensitive window featuring four emitter-detector channels operative to detect a glide movement in both horizontal and vertical directions, in accordance with an embodiment of the present invention. FIGS. 18 and 19 illustrate a mouse pad or other two-dimensional control. This configuration places the emitters and detectors directly beneath the control surface. FIG. 18 shows four receivers 222.1-222.4 surrounding an emitter 122 to provide four channels, substantially similar to those described hereinabove with reference to FIGS. 14-17. In FIG. 19 an infrared light transmissive cover 950 with a cross shape 951 etched thereon is placed above the emitters and receivers. The cross shape indicates navigational paths to the user.

A system with four channels also provides information in three dimensions regarding a proximal object. For example, begin with the two channels of FIG. 2 to provide height information. Add one channel to provide lateral information as in FIG. 3. Add one more channel to provide information in a second lateral dimension, also as in FIG. 3.

Applications

Aspects of the invention relate to providing a thin window spanning the height or thickness of a device, such as a mobile phone. A user interacts with the phone by performing finger gestures against this window and the proximity sensor detects the position or gesture of the finger. One usage is to replace physical buttons. In a basic case light from an LED is sent out of the device and reflected by the finger. The reflected light is detected by two PDs situated on either side of the LED and the position of the finger is interpolated from the signals. For instance such an arrangement could replace the volume buttons on a mobile phone.

Figure 20:
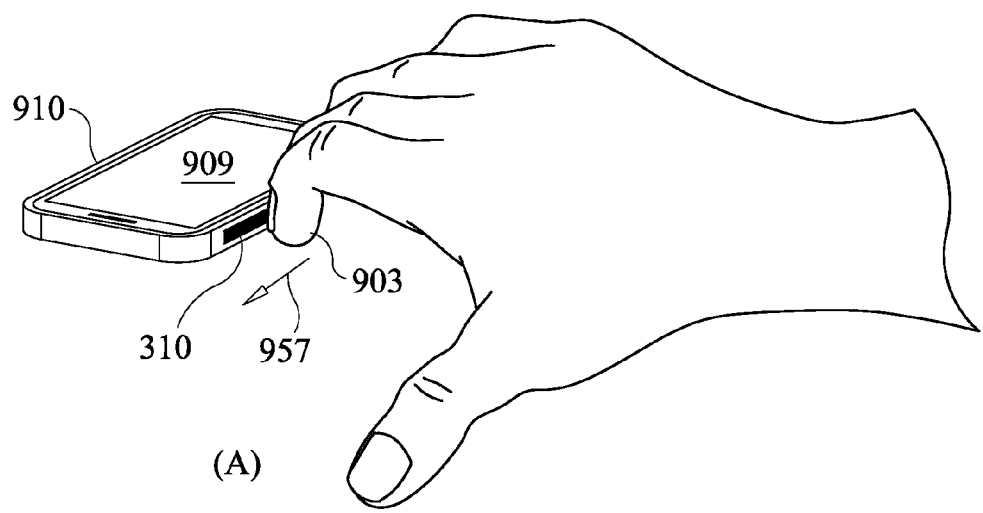
FIGS. 20-22 are simplified diagrams of hovering gestures using the touch sensitive window of FIGS. 4 and 5, in accordance with an embodiment of the present invention.
Figure 20:
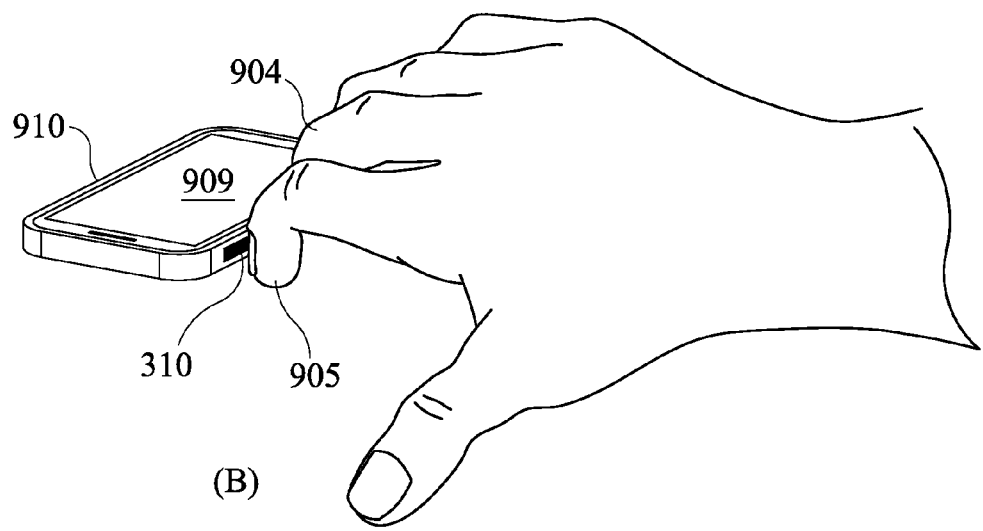
Figure 21:
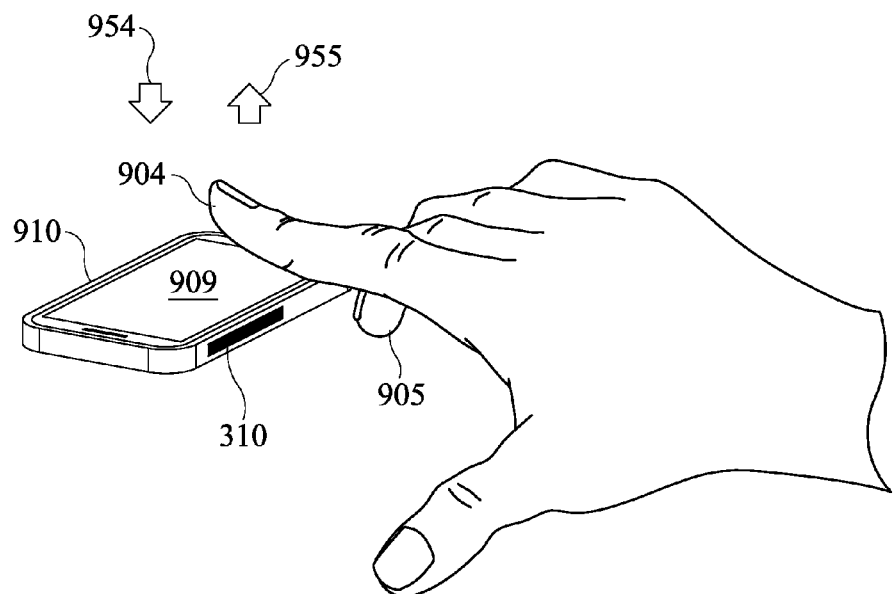
Figure 22:
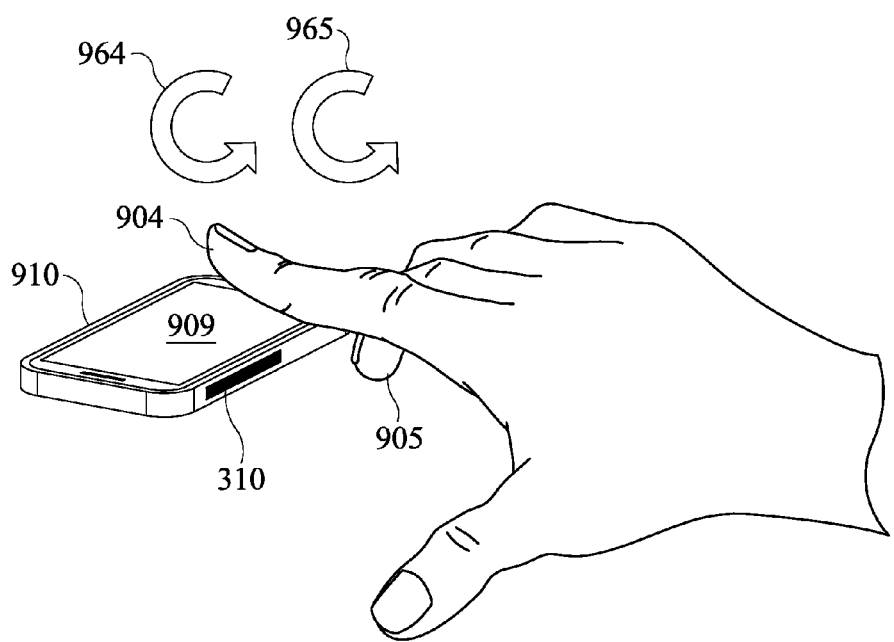

Reference is made to FIGS. 20-22, which are simplified diagrams of hovering gestures using the touch sensitive window of FIGS. 4 and 5, in accordance with an embodiment of the present invention. FIG. 20 shows a user interacting with a control in accordance with an embodiment of the present invention. FIG. 20A shows a mobile phone or other electronic device 910 having a screen 909 and a control window 310. A finger 903 interacts with this control by sliding along the control or by tapping the control. A gesture of sliding finger 903 along window 310 is indicated by arrow 957.

FIG. 20B shows the same mobile phone or other electronic device 910 having a screen 909 and a control window 310. Two fingers 904 and 905 interact with this control. As an example, the fingers may alternately approach window 310 and move away from window 310. Thus, in a first position of the gesture, finger 904 is placed opposite and near window 310 and finger 905 is placed opposite and distant from window 310. Next, finger 904 is moved opposite and near window 310 and finger 905 is placed opposite and distant from window 310. This example gesture can be seen as two fingers "walking" towards the control. This gesture uses the proximity detection described hereinabove to detect the finger movement toward and away from the control window. Another two-finger gesture is a pinch gesture whereby two fingers are brought together along the length of the control window. A spread gesture or "un-pinch" gesture moves two fingers away from each other along the length of the control window.

FIG. 21 illustrates another two-finger gesture on electronic device 910 having a screen 909 and a control window 310. Two fingers 904 and 905 interact with this control according to arrows 954 and 955. The gesture begins with lowered finger 905 opposite a portion of window 310 and finger 904 raised above the window. Finger 904 is lowered as per arrow 954 while finger 905 is raised as per arrow 955.

FIG. 22 illustrates another two-finger gesture on electronic device 910 having a screen 909 and a control window 310. Two fingers 904 and 905 interact with this control according to arrows 964 and 965. The gesture begins with lowered finger 905 opposite a portion of window 310 and finger 904 raised above the window. Fingers 904 and 905 perform circular motions at different phases to mimic "running in place" as per arrows 964 and 965.

Expanding the User Interface

Aspects of the subject invention relate to an expanded user interface whereby the user performs gestures beyond the physical extent of an electronic device. The device includes one or more arrays of proximity sensors along the outer edges of the device housing. This detector array detects user gestures performed outside the perimeter of the device.

Figure 23:
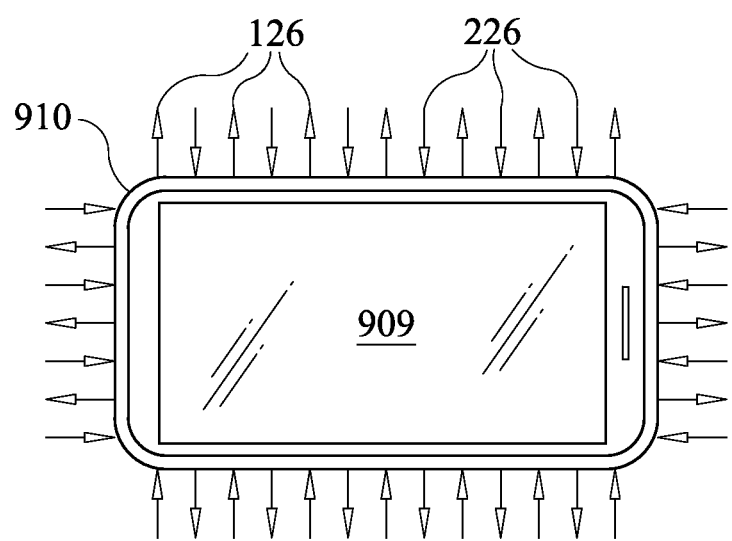
FIG. 23 is a simplified diagram of an electronic device with proximity sensors along all four device edges, in accordance with an embodiment of the present invention.

Reference is made to FIG. 23, which is a simplified diagram of an electronic device with proximity sensors along all four device edges, in accordance with an embodiment of the present invention. FIG. 23 shows an electronic device 910 with a screen 909. Along all four outer edges of device 910 are outgoing arrows indicating emitter light beams 126, and incoming arrows indicating receiver light beams 226, associated with arrays of proximity sensors along the edges of device 910 as described hereinabove.

Figure 24:
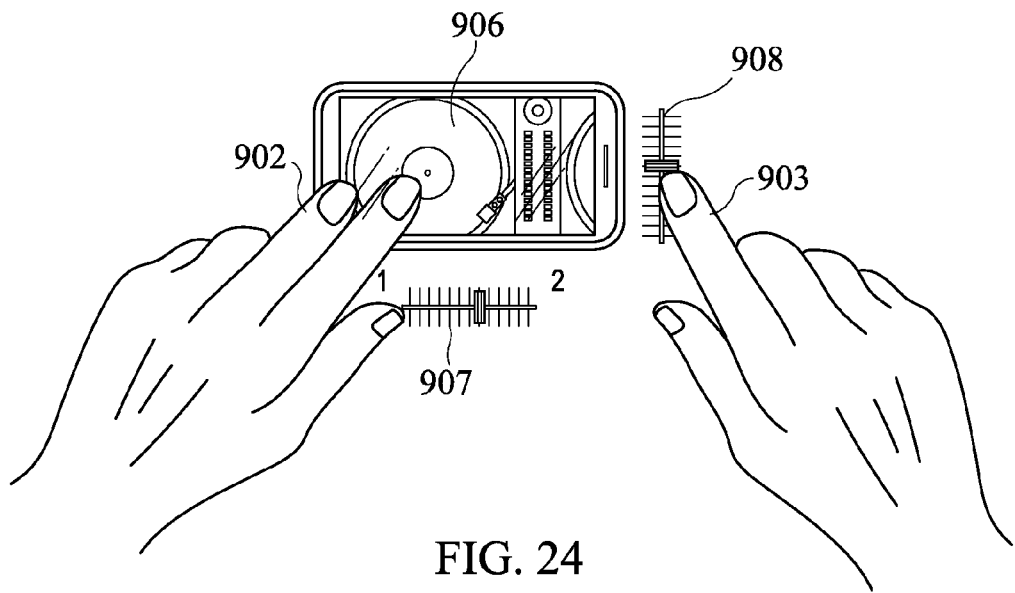
FIG. 24 is a simplified illustration of a user interface for a music application, in accordance with an embodiment of the present invention.

Reference is made to FIG. 24, which is a simplified illustration of a user interface for a music application, in accordance with an embodiment of the present invention. FIG. 24 shows a music mixer or DJ application. Screen 909 is a touch screen displaying an interactive graphic of a record turntable 906 that is spun by a user rubbing his fingers 902 on the graphic. The device is placed on a table or other flat surface. The user manipulates parameters of the music application, such as volume, tempo, bass, treble, by manipulating slider controls 907 and 908. In order to move the slider bar within the control, the user performs a sliding gesture parallel to an edge of the device. This is illustrated by finger 902 touching the slider bar in control 908. Although slider controls 907 and 908 are illustrated in FIG. 24, in certain embodiments of the invention these controls are not presented to the user outside the device. Rather, the user interface responds to sliding one or more fingers parallel to an edge as if an actual or virtual slider control were being manipulated. Each edge controls a different music application parameter.

Figure 25:
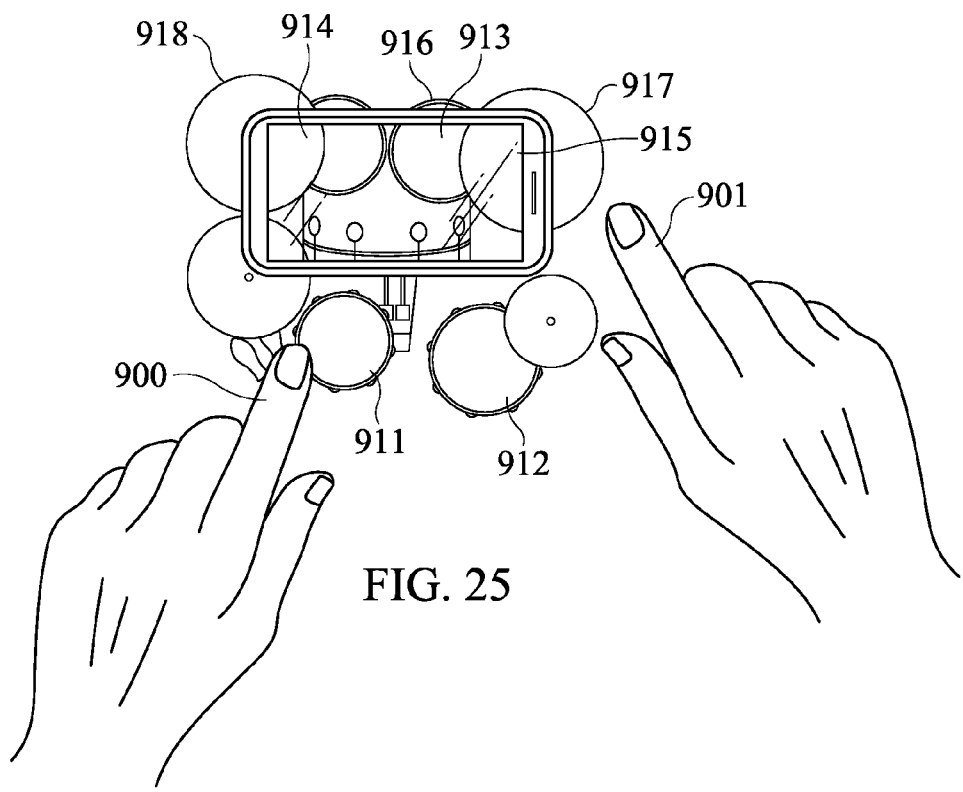
FIG. 25 is a simplified illustration of a user interface for a drum application, in accordance with an embodiment of the present invention.

Reference is made to FIG. 25, which is a simplified illustration of a user interface for a drum application, in accordance with an embodiment of the present invention. Screen 909 presents a drum set as seen from above, including various drums and cymbals 911-915. The drum set graphic is larger than the screen such that only a portion of certain drums and cymbals are shown on the screen. However, by extending the circle of a partially viewable drum or cymbal, the user can imagine where it would extend outside the screen. When the user touches or taps a location outside the screen at which the extension of a drum or cymbal would be located, such as locations 916-918, the device generates an appropriate drum or cymbal sound in response. In FIG. 25, finger 901 is about to touch an extension 917 of cymbal 915. In certain embodiments the extension is not presented to the user outside the device. Rather, the user interface responds to finger taps at locations around the device that correspond to where a drum or cymbal would logically be placed according to the drum set graphic.

Thus the drum set is arranged in a layout that is larger than the display, wherein at any given time a subset of the drum set graphic is presented on the display. In certain embodiments, the drum set graphic pans, relative to the display, to bring a subset of the drum set graphic into the display, and to move another subset of the drum set graphic out of the display. The logical locations outside the display of the various drums and cymbals moved out of the display are meaningful to the user interface: when the user touches or taps one of these locations the device generates a corresponding drum or cymbal sound in response. The user pans the drum set graphic to understand where various drums are logically located outside the screen. In certain embodiments, the user may also zoom the drum set graphic to understand where certain drums are located outside the displayed portion of the graphic. In this case, when the drum set graphic is zoomed out the entire graphic fits on the display. As the graphic is zoomed in, it increases in size to the point that portions of the graphic do not fit on the screen. However, during the zoom operation the user sees where these off screen portions are logically located so that he can touch those locations to elicit drum sounds from the device. In FIG. 25, finger 900 is touching the logical location of drum 911 which is completely outside the display.

Figure 26:
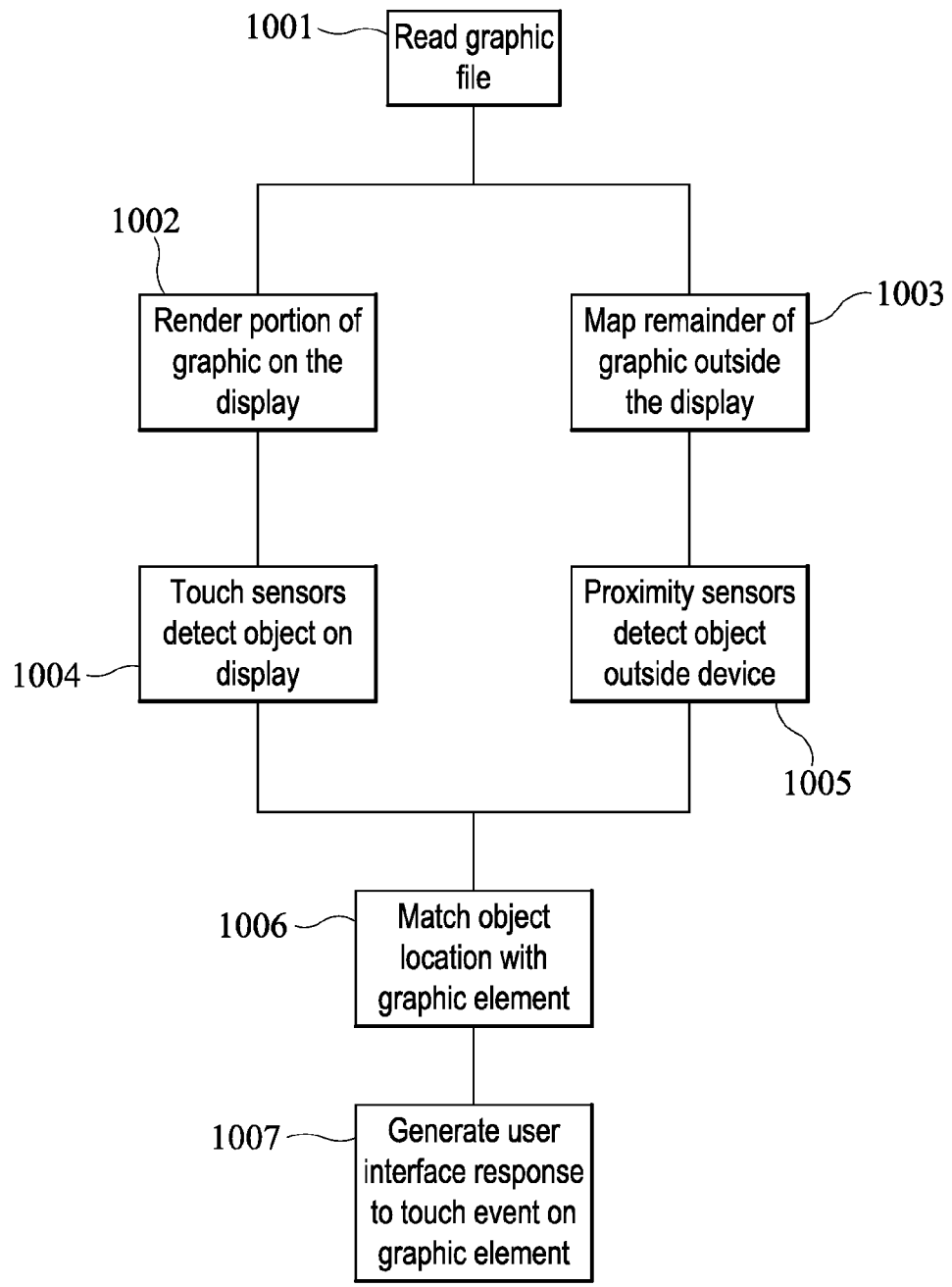
FIG. 26 is a flow chart of a method for providing a graphical user interface (GUI), in accordance with an embodiment of the present invention.

Reference is made to FIG. 26, which is a flow chart of a method for providing a graphical user interface (GUI), in accordance with an embodiment of the present invention. The GUI is described with reference to steps 1001-1007. At step 1001 a graphic file is read. The graphic file is either one graphic or a composite graphic made up of various graphic elements from one or more files, e.g., graphics of various drums that together form a drum set. At step 1002 a portion of the graphic is rendered on the screen, while the remainder of the graphic is mapped outside the screen. This may be because the graphic is too large to fit on the screen, or because it is situated near an edge of the screen. Alternatively some of the graphic elements are dynamic, and move and drift off the screen. Therefore, there are portions of the graphic elements that are not displayed, and these portions are mapped to locations outside the device at step 1003. At step 1004 touch sensors on the screen detect a touch. At step 1005 proximity sensors around the device edges detect an object outside the device. Both detections are used by the user interface. In some instances only one detection occurs. In other instances multiple detections occur concurrently, e.g., multi-touch gestures are detected on the screen or multiple objects are detected at various locations around the device. The user interface maps each detected location or gesture to a corresponding graphic element at step 1006. And at step 1007 the device generates user interface outputs that correspond to the detected touch or proximity locations or gestures.

Figure 27:
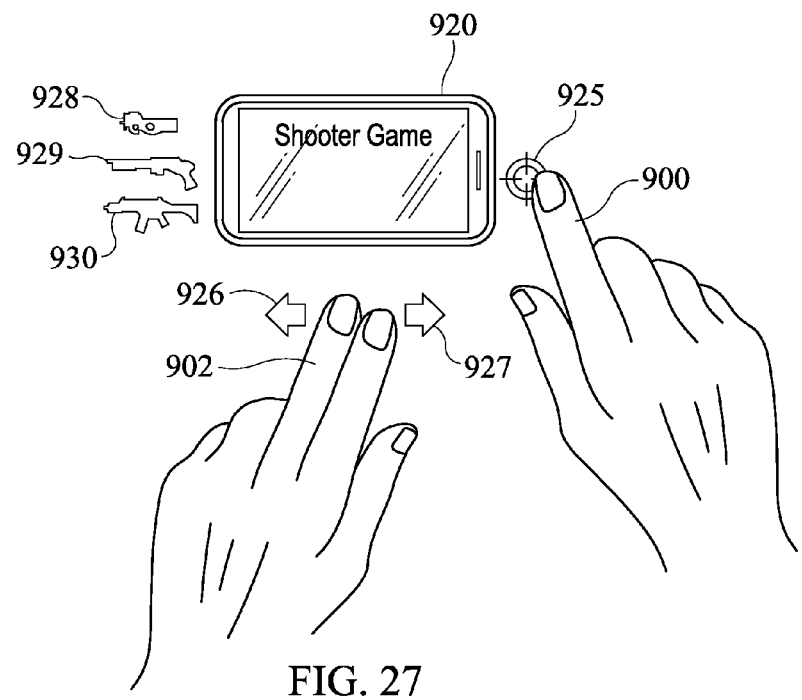
FIG. 27 is a simplified illustration of a user interface for a shooter game, in accordance with an embodiment of the present invention.

Reference is made to FIG. 27, which is a simplified illustration of a user interface for a shooter game, in accordance with an embodiment of the present invention. A user interface for controlling a shooter game 920 involves finger gestures along different sides of the device. A player moves within the game's virtual world by finger movements along the bottom edge of the device. FIG. 27 shows left and right arrows indicating sweep gestures by fingers 902 that move the player within the game's virtual world. The user aims his gun by performing gestures near the right edge of the device as indicated by sight 925. The proximity sensors detect the movement of finger 901 in two or three dimensions enabling two-dimensional or three-dimensional manipulation of the gun. The user selects a different weapon by tapping at locations along the device's left edge. FIG. 27 shows guns 928-930 along this edge. A tap at each location selects the corresponding weapon.

Figure 28:
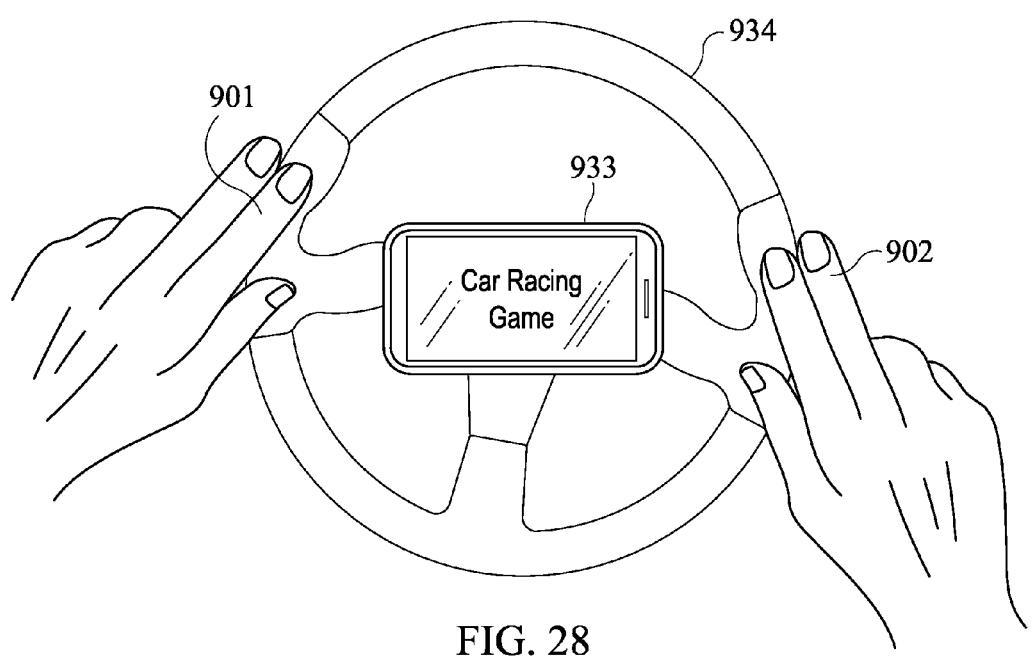
FIG. 28 is a simplified illustration of a user interface for a car racing game, in accordance with an embodiment of the present invention.

Reference is made to FIG. 28, which is a simplified illustration of a user interface for a car racing game, in accordance with an embodiment of the present invention. FIG. 28 shows a car racing game 933 in which a player steers a car through a race course. The player steers the car by gliding his fingers 901 and 902 along a circular path surrounding the device. The circular path has the shape of an imaginary steering wheel surrounding the device, as illustrated by steering wheel 934. Gliding fingers clockwise along this circular path steers the car to the right, and gliding fingers counterclockwise along this path steers the car to the left—as if the gliding fingers are rotating a steering wheel.

Figure 29:
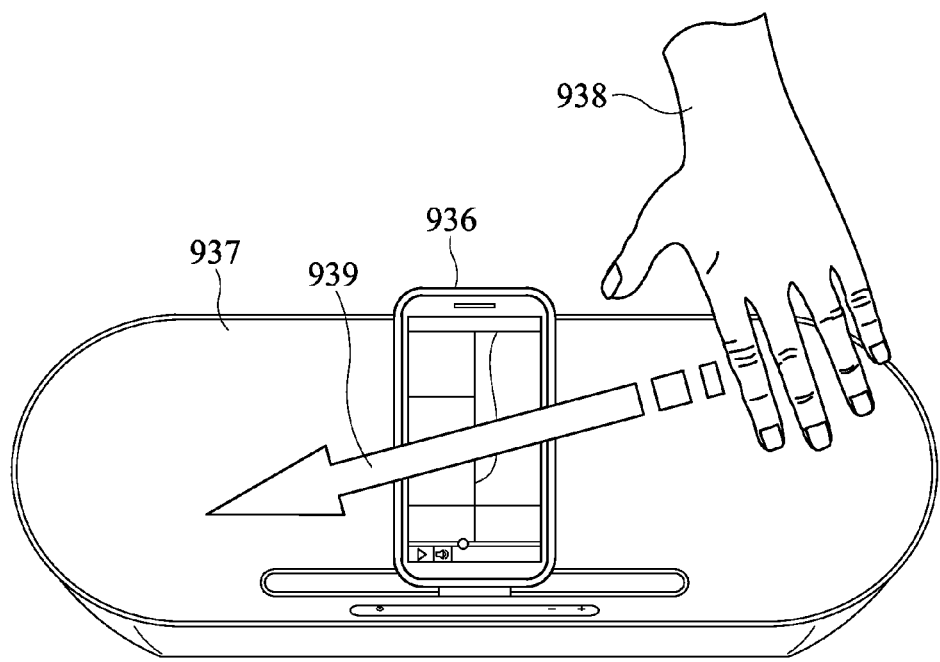
FIG. 29 is a simplified illustration of a user interface for a music player application, in accordance with an embodiment of the present invention.

Reference is made to FIG. 29, which is a simplified illustration of a user interface for a music player application, in accordance with an embodiment of the present invention. FIG. 29 shows an MP3 player 936 in a stereo dock 937 being controlled by user interface gestures in the form of a hand 938 waving above and across the front of the device as indicated by arrow 939. In this case, in order that the proximity sensor arrays around the edges of the device detect a hand above the device, the proximity sensor light beams are directed upward, perpendicular to the front of the device.

Figure 30:
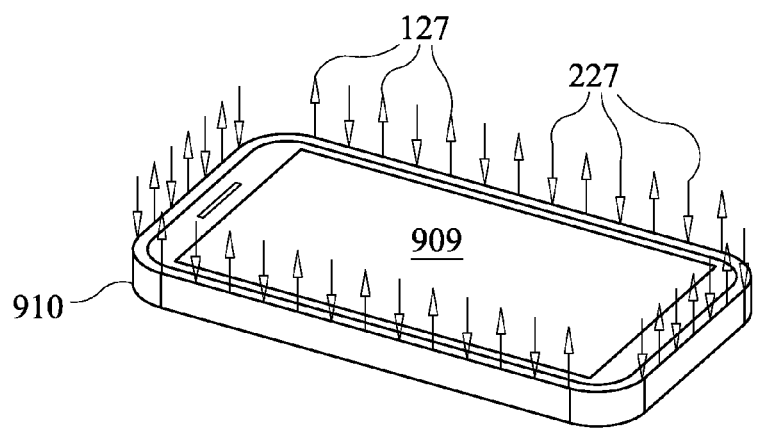
FIG. 30 is a simplified diagram of an electronic device with proximity sensors along all four device edges, in accordance with an embodiment of the present invention.

In this regard, reference is made to FIG. 30, which is a simplified diagram of an electronic device with proximity sensors along all four device edges, in accordance with an embodiment of the present invention. FIG. 30 shows device 910 with screen 909 and emitter light beams 127 directed upward along the edges of the device. Hover detection occurs when an object reflects these upward beams back onto the proximity sensor receivers. Thus, emitter beams 127 become downward receiver beams 227 after being reflected by a hovering object.

Figure 31:
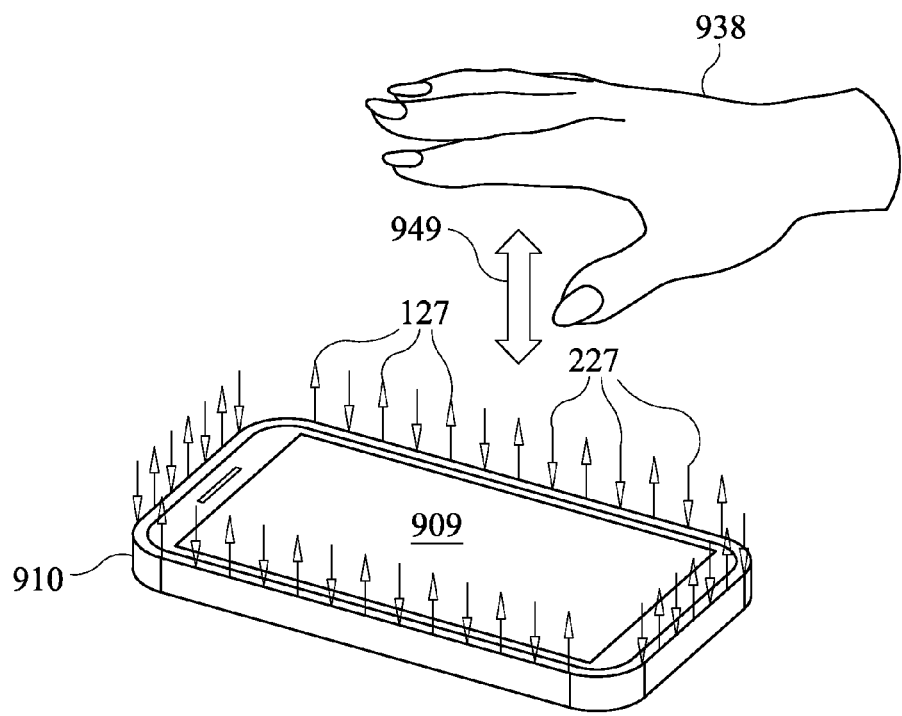
FIG. 31 is a simplified diagram of a user interface "bounce" gesture performed on the electronic device of FIG. 30, in accordance with an embodiment of the present invention.

Reference is made to FIG. 31, which is a simplified illustration of a user interface "bounce" gesture performed on device 910, in accordance with an embodiment of the present invention. As shown in FIG. 31, a user bounces his hand 938 down and up above a screen, without touching the screen, as represented by a two-sided arrow 494. Proximity detection beams 127-227 are used to recognize this bounce gesture as a series of increases in light reflected by hand 938 as it approaches the screen, followed by a series of decreases in light reflected by hand 938 as it moves away from the screen. In one embodiment of the present invention, the bounce gesture is used to activate a selected graphical user interface control.

Figure 32:
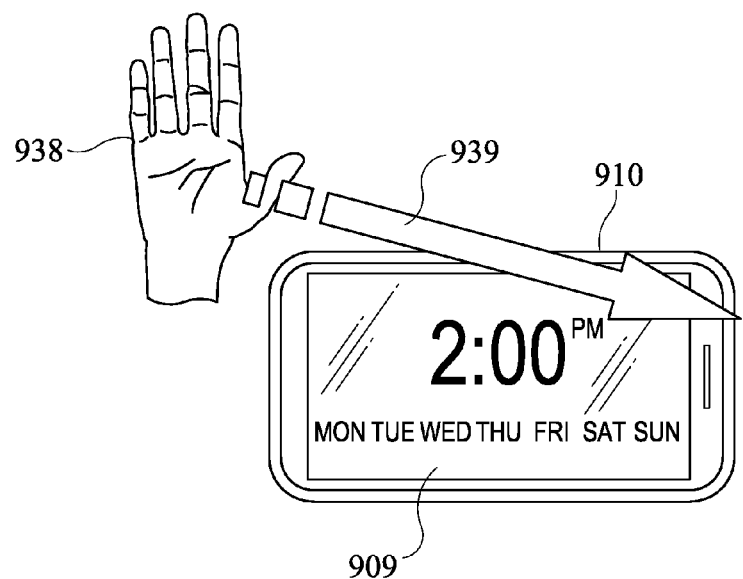
FIG. 32 is a simplified illustration of a user interface for an alarm clock application, in accordance with an embodiment of the present invention.

Reference is made to FIG. 32, which is a simplified illustration of a user interface for an alarm clock application, in accordance with an embodiment of the present invention. FIG. 32 shows an alarm clock application on a mobile phone device 910. The user waves a hand 938 above and across the screen as illustrated by arrow 939 to turn off the alarm. In this case, too, the proximity sensors along the edges of the device are configured to project beams upward, perpendicular to screen 909.

Figure 33:
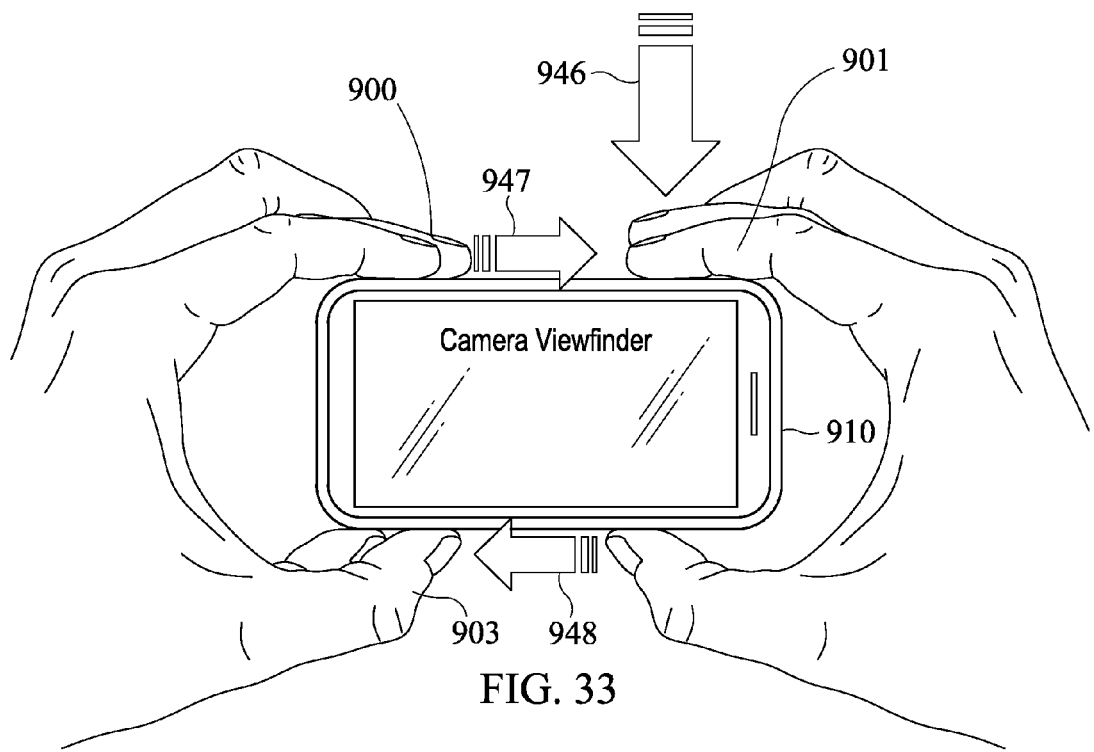
FIG. 33 is a simplified illustration of a user interface for a camera application, in accordance with an embodiment of the present invention.

Reference is made to FIG. 33, which is a simplified illustration of a user interface for a camera application, in accordance with an embodiment of the present invention. FIG. 33 shows a camera application on a mobile phone device 910 that is controlled by tap gestures and slide gestures along the outer edges of the phone. To take a picture, a user taps finger 901 at the upper right corner of the device as indicated by arrow 946. Other parameters are configured or set by slide gestures along the top and bottom edges of device 910, e.g., sliding finger 900 as indicated by arrow 947, and sliding finger 903 as indicated by arrow 948.

Protective Cover with Embedded Sensors

Aspects of the subject invention relate to a removable protective cover for an electronic device, such as a cell phone, an e-book reader, a music player and a tablet computer, that includes proximity sensors for detecting user gestures performed on an outside surface of the cover, and user gestures performed in the air in the vicinity of the cover. Such user gestures include contact gestures such as slides and taps as shown in FIGS. 6 and 33; and non-contact gestures in the air such as those shown in FIGS. 20-32. Thus it will be appreciated by those skilled in the art that the cover enhances the electronic device to be operable to respond to such user gestures. In an embodiment of the present invention, the cover includes a processor for controlling operation of the proximity sensors. In an embodiment of the present invention, the cover includes wireless communication circuitry, such as BLUETOOTH® circuitry, for transmitting information about user gestures that are detected by the proximity sensors in the cover, under control of the processor, to the electronic device; in response to which the electronic device processes commands based on the user gestures. Such commands include inter alia answer/reject incoming call commands, page turn commands for ebooks, volume control commands, and play commands for music.

The cover may be made of a silicone-based material. The cover may also include a small battery.

Figure 34:
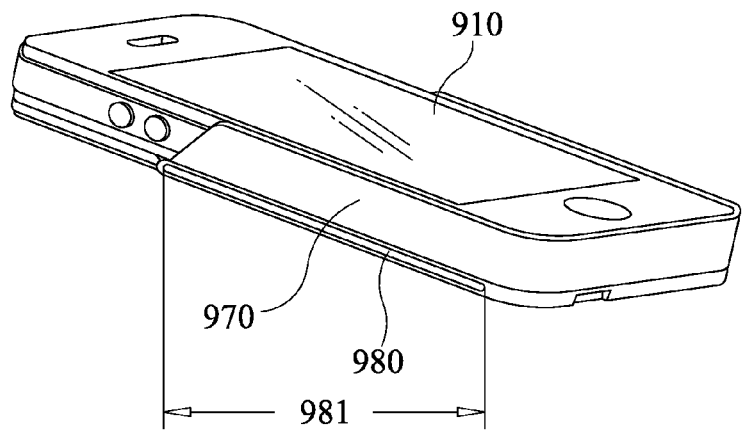
FIG. 34 is a simplified illustration of a removable cover attached to a handheld electronic device, in accordance with an embodiment of the present invention.

Reference is made to FIG. 34, which is a simplified illustration of a removable cover 970 attached to a handheld electronic device 910, in accordance with an embodiment of the present invention. As seen in FIG. 34, cover 970 at least partially covers rear and side surfaces of electronic device 910. In one embodiment of the present invention, electronic device 910 is a cellphone. In another embodiment of the present invention, electronic device 910 is a music player. In yet another embodiment of the present invention, electronic device 910 is a tablet computer.

A touch slider 980, shown in FIG. 34 along the left side edge of cover 970, is operable to detect finger glide gestures and/or tap gestures. The length of touch slider 980 is indicated by element 981. Touch slider 980 comprises a narrow slit through which light is transmitted out of cover 970 and reflected back into cover 970. A second touch slider (element 982 of FIG. 35) may be provided along the right side edge of cover 970. In operation, a user slides a finger along slider 980 in one direction to answer an incoming call, and slides the finger along slider 980 in the opposite direction to reject the incoming call. In one embodiment of the present invention, slider 980 is similar to the sliders shown in FIGS. 4-6.

Figure 35:
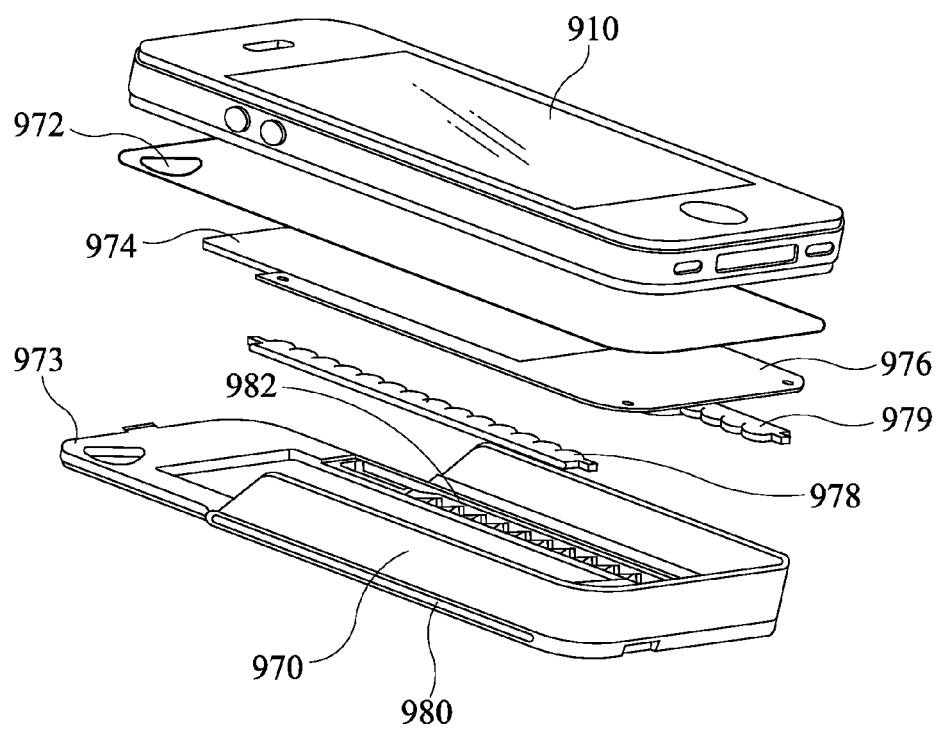
FIG. 35 is an exploded view of the removable cover of FIG. 34, in accordance with an embodiment of the present invention.

Reference is made to FIG. 35, which is an exploded view of cover 970, in accordance with an embodiment of the present invention. The rear portion of cover 970 is a slim housing formed by a front housing panel 972 and a rear housing panel 973. Front and rear housing panels 972 and 973 encase (i) a printed circuit board (PCB) 976 on which wireless communication circuitry, light emitters and light receivers are mounted, and (ii) series of lenses 978, 979 that direct light from the emitters outward. Touch slider 980 is formed by a narrow slit along a lower edge of cover 970. Lenses 978 are exposed through this opening, and direct light from the emitters outward through touch slider 980. When a user places a finger on slider 980, the finger reflects the outward-directed light back through lens 978 onto one or more of the light receivers. A similar touch slider 982 is formed along the right side edge of cover 970 through a narrow slit that exposes lenses 979.

PCB 976 includes wireless communication circuitry for communication with device 910. PCB 976 also includes a processor configured to operate the light emitters and light receivers, and to operate the wireless communication circuitry to transmit commands to device 910 based on gestures detected when the light receivers sense an increase in reflected light. A battery 974 powers the electrical components used by cover 970. Battery 974 is housed in rear housing panel 973.

Figure 36:
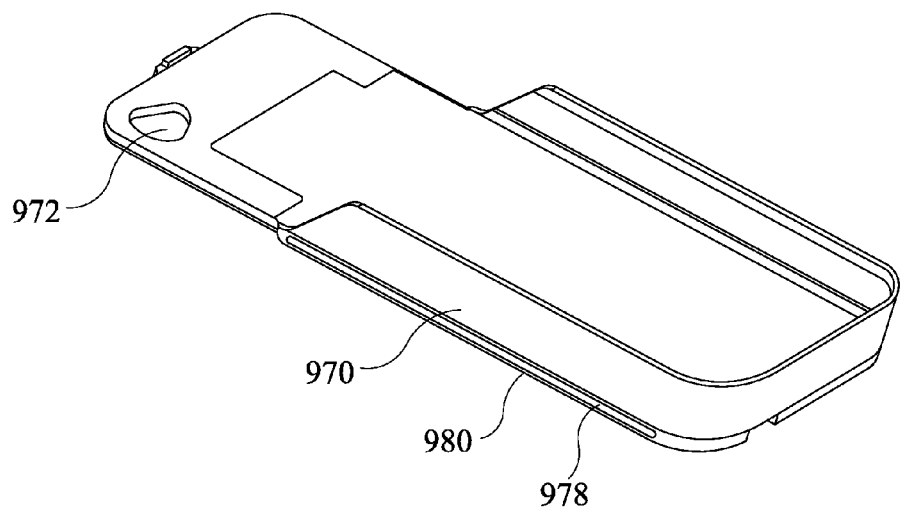
FIG. 36 is an assembled view of the removable cover of FIG. 34, in accordance with an embodiment of the present invention.

Reference is made to FIG. 36, which is an assembled view of cover 970, in accordance with an embodiment of the present invention. As shown in FIG. 36, touch slider 980 exposes lenses 978.

Figure 37:
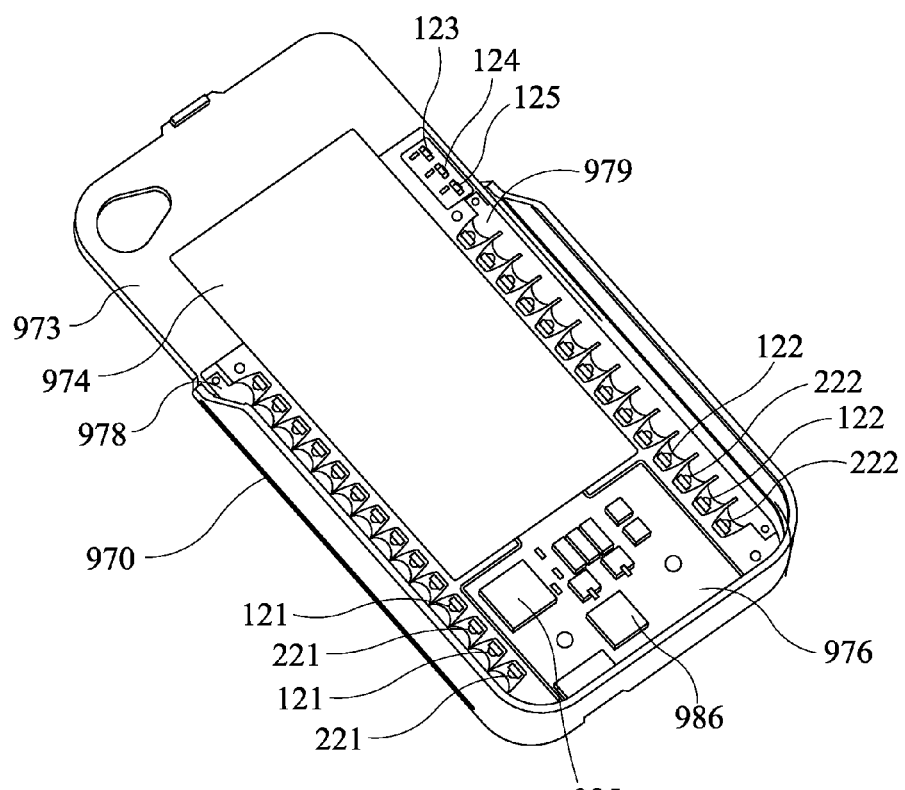
FIG. 37 is a top perspective view of the removable cover of FIG. 34, in accordance with an embodiment of the present invention.

Reference is made to FIG. 37, which is a top perspective view of cover 970 with front housing panel 972 removed, in accordance with an embodiment of the present invention. FIG. 37 shows an arrangement of a row of alternating light emitters 121 and light receivers 221, and another row of alternating light emitters 122 and light receivers 222. Series 978 of lenses is aligned with the row of alternating emitters and receivers 121-221, and series 979 of lenses is aligned with the row of alternating emitters and receivers 122-222.

FIG. 37 also shows three emitters 123-125 of visible light, where each emitter emits light of a different color, e.g., red, green and blue. The visible colored light emitted by these emitters is transmitted through one of the series of lenses, e.g., lens series 979, thereby coloring the entire proximity sensor strip. Representative applications for coloring the proximity sensor strip are described below with reference to FIG. 39.

FIG. 37 also shows an emitter and receiver driver circuit 985, which is operable to drive the emitters and to receive outputs from the receivers. Such a circuit is described in assignee's co-pending patent application U.S. Ser. No. 13/424,413 entitled ASIC CONTROLLER FOR LIGHT-BASED TOUCH SCREEN, the contents of which are hereby incorporated by reference in their entirety. A CPU 986 controls driver circuit 985, and includes an embedded core for a wireless communication protocol, such as BLUETOOTH®.

Figure 38:
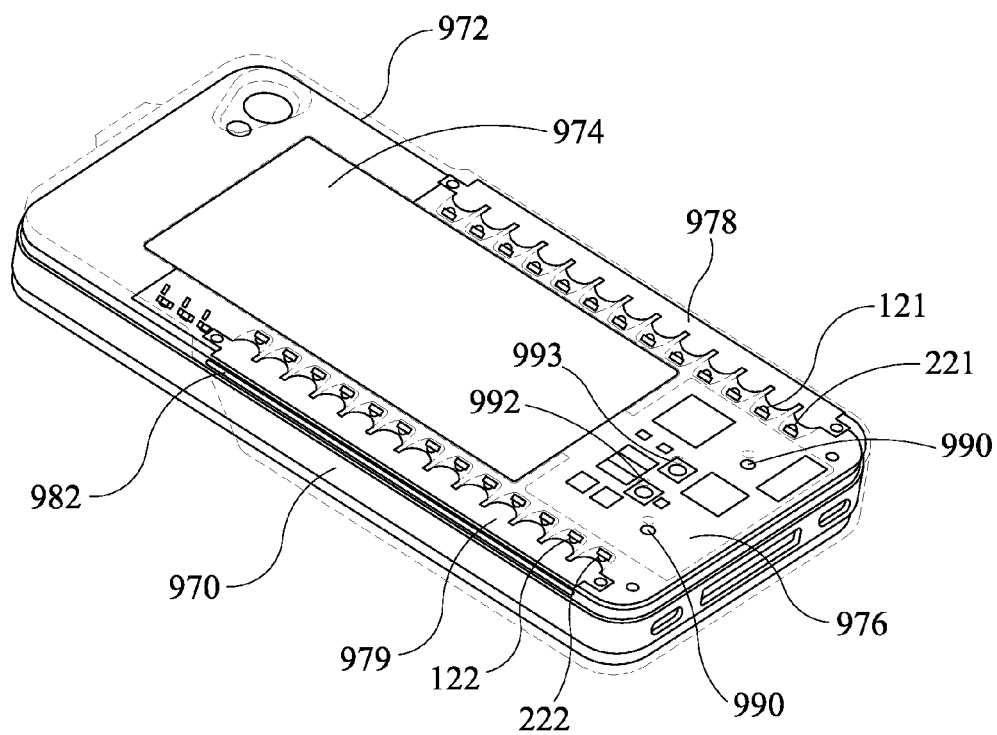
FIG. 38 is a bottom perspective view of the removable cover of FIG. 34, in accordance with an embodiment of the present invention.

Reference is made to FIG. 38, which is a bottom perspective transparent view of cover 970, in accordance with an embodiment of the present invention. FIG. 38 shows the arrangement of PCB 976, lens series 978 and 979, and rows of alternating emitters 121, 122 and light receivers 221, 222 inside the rear portion of cover 970. FIG. 38 also shows the right-side slider 982 which exposes lens series 979 along the right side edge of cover 970.

A power socket 990 for charging battery 974 is provided by socket holes in the rear surface of casing 970. In addition, two on/off button controls 992 and 993 are provided, exposed on the rear surface of cover 970. Button 992 toggles the proximity sensors on and off. Button 993 toggles detectability of the proximity sensor system to external BLUETOOTH® devices, such as the covered phone.

Figure 39:
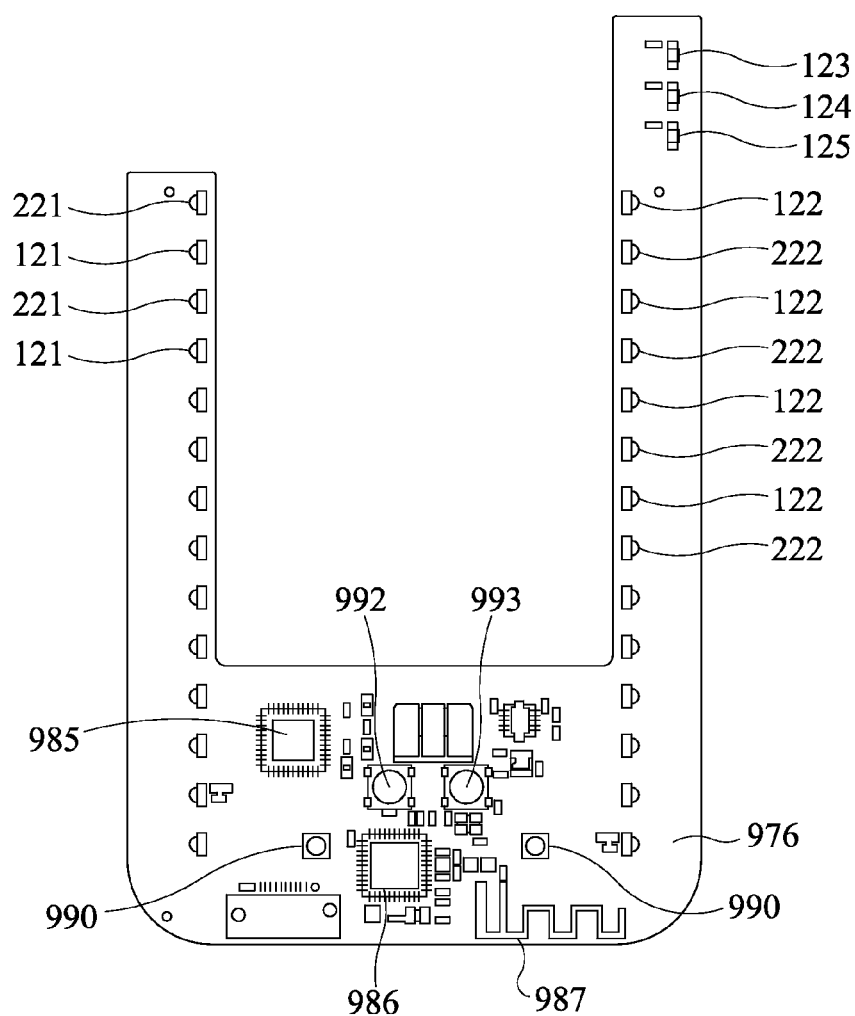
FIG. 39 is a schematic layout of the printed circuit board in the removable cover of FIG. 34, in accordance with an embodiment of the present invention.

Reference is made to FIG. 39, which is a schematic layout of PCB 976, in accordance with an embodiment of the present invention. Emitters 121 and 122, and receivers 221 and 222 in the two rows of alternating emitters and receivers generally operate in the near infrared spectrum, at wavelengths of approximately 930 nm. Lens series 978 and 979, shown in FIGS. 35, 37 and 38, are transparent to this wavelength, but may be opaque for light in the visible range.

In some embodiments of the present invention, lens series 978 and 979 are transparent for light in the visible range, in order to provide visual cues to a user. FIG. 39 shows three emitters 123-125 of visible light, where each emitter emits light of a different color, e.g., red, green and blue. Visible colored light from these emitters travels through one of the lens series, e.g., lens series 979, coloring the proximity sensor strip. E.g., when a user charges battery 974 by inserting connector prongs into socket 990, the proximity sensor strip turns red. When battery 974 is fully charged, the proximity sensor strip changes from red to blue. When the proximity sensors are detectable to external BLUETOOTH® devices, such as the covered phone, the proximity sensor strip changes to green. When detactability is turned off, the strip light is turned off.

FIG. 39 also shows an antenna 987 used by the embedded BLUETOOTH® core in CPU 986, for wireless communication with the covered phone.

Whereas cover 970 illustrated in FIGS. 34-38 includes one-dimensional sliders along edges of the cover, other embodiments are also within the scope of the present invention. Such embodiments include inter alia all of the arrangements of proximity sensors described hereinabove, but having some or all of the proximity sensors mounted in cover 970 instead of in device 910; e.g., proximity sensors arranged in two dimensions on the rear of cover 970, as described hereinabove with reference to FIGS. 18 and 19, and proximity sensors arranged around all four sides of cover 970, as described hereinabove with reference to FIGS. 23 and 30. Thus it will be appreciated by those skilled in the art that cover 970 may be used in conjunction with device 910 to enable the various applications (music, drums, games, alarm clock, camera) described hereinabove with reference to FIGS. 24, 25, 27-29, 32 and 33, and the method described hereinabove with reference to FIG. 26.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. A removable cover for a handheld electronic device, comprising:
   a protective cover that at least partially covers rear and side surfaces of a handheld electronic device, comprising narrow slits;
   a plurality of proximity sensors mounted in said protective cover for detecting user gestures performed outside of the electronic device, comprising:
      alternating light emitters and light receivers; and
      lenses that direct light beams from said light emitters out of said protective cover through said narrow slits, wherein a finger that covers one or more of said lenses reflects the directed light beams back through at least one of said narrow slits and, via said lenses, onto one or more of said light receivers;
   a battery;
   wireless communication circuitry; and
   a processor configured to operate said proximity sensors, and to operate said wireless communication circuitry to transmit commands to the electronic device based on gestures detected by said proximity sensors.

2. The removable cover of claim 1 wherein the electronic device comprises a cell phone, and wherein the transmitted commands comprise commands to answer/reject an incoming call.

3. The removable cover of claim 2 wherein the transmitted commands comprise commands to control volume of sound produced by the electronic device.

4. The removable cover of claim 1 wherein the electronic device comprises a music player, and wherein the transmitted commands include play control commands.

5. The removable cover of claim 1 wherein said wireless communication circuitry comprises short range radio communication circuitry.

6. The removable cover of claim 1 wherein the user gestures detected by said proximity sensors comprise slide and tap gestures along a surface of said protective cover.

7. The removable cover of claim 1 wherein the user gestures detected by said proximity sensors comprise non-contact gestures performed in the air, in the vicinity of said protective cover.

8. The removable cover of claim 1 wherein said proximity sensors are arranged as a strip along a side of said protective cover.

9. The removable cover of claim 1 wherein said proximity sensors are arranged in two dimensions on the rear of said protective cover.

10. The removable cover of claim 9 wherein said processor transmits a first command to the electronic device based on a first slide gesture, detected by said proximity sensors, performed in a first direction on the rear side of said protective cover, and transmits a second command to the electronic device based on a second slide gesture, detected by said proximity sensors, performed in a second direction, substantially perpendicular to the first direction, on the rear side of said protective cover.

11. The removable cover of claim 9 wherein said processor transmits to the electronic device a command to control an application running on the electronic device, based on a wave gesture, detected by said proximity sensors, performed over the rear of said protective cover.

12. The removable cover of claim 1 wherein said lenses are positioned inside of said protective cover facing the narrow slits in said protective cover.

13. The removable cover of claim 12 wherein the electronic device comprises a cell phone, and wherein said processor transmits to the electronic device a command to answer an incoming phone call, based on a slide gesture along one of the narrow slits, detected by said proximity sensors.

14. The removable cover of claim 12 wherein the electronic device comprises a cell phone, and wherein said processor transmits to the electronic device a command to hang up a phone call, based on a slide gesture along one of the narrow slits, detected by said proximity sensors.

15. The removable cover of claim 12 wherein said processor transmits to the electronic device a command to modify volume of sound produced by the electronic device, based on a slide gesture along one of the narrow slits, detected by said proximity sensors.

16. The removable cover of claim 12 wherein the electronic device is a music player, and wherein said processor transmits a play control command to the electronic device, in response to a slide gesture along one of the narrow slits, detected by said proximity sensors.

17. The removable cover of claim 12 wherein the electronic device comprises a camera, and wherein said processor transmits a camera control command to the electronic device, based on a tap gesture on one of the narrow slits, detected by said proximity sensors.

18. The removable cover of claim 12 wherein said processor transmits a command to the electronic device to control an application running on the electronic device, based on a slide gesture performed at a distance away from one of the narrow slits, detected by said proximity sensors.

* * * * *